(12) United States Patent
Cernea

(10) Patent No.: US 7,376,030 B2
(45) Date of Patent: *May 20, 2008

(54) MEMORY SENSING CIRCUIT AND METHOD FOR LOW VOLTAGE OPERATION

(75) Inventor: Raul-Adrian Cernea, Santa Clara, CA (US)

(73) Assignee: Sandisk Corporation, Milpitas, CA (US)

(*) Notice: Subject to any disclaimer, the term of this patent is extended or adjusted under 35 U.S.C. 154(b) by 43 days.

This patent is subject to a terminal disclaimer.

(21) Appl. No.: 11/383,247

(22) Filed: May 15, 2006

(65) Prior Publication Data

US 2006/0203545 A1 Sep. 14, 2006

Related U.S. Application Data

(63) Continuation of application No. 11/015,199, filed on Dec. 16, 2004, now Pat. No. 7,046,568, which is a continuation-in-part of application No. 10/665,828, filed on Sep. 17, 2003, now Pat. No. 7,023,736, which is a continuation-in-part of application No. 10/254,830, filed on Sep. 24, 2002, now Pat. No. 7,196,931.

(51) Int. Cl.
*G11C 7/02* (2006.01)
(52) U.S. Cl. .................. 365/207; 365/149; 365/203; 365/204
(58) Field of Classification Search ............. 365/207, 365/149, 203, 204, 233
See application file for complete search history.

(56) References Cited

U.S. PATENT DOCUMENTS 4,357,685 A 11/1982 Daniele et al.
4,785,427 A 11/1988 Young
5,012,447 A 4/1991 Matsuda et al.
5,021,999 A 6/1991 Kohda et al.
5,070,032 A 12/1991 Yuan et al.

(Continued)

FOREIGN PATENT DOCUMENTS

EP 1134746 A2 9/2001

(Continued)

OTHER PUBLICATIONS

USPTO, "Notice of Allowance and Fee(s) Due," mailed in related U.S. Appl. No. 11/321,953 on Jun. 14, 2007, 15 pages.

(Continued)

*Primary Examiner*—David Lam
(74) *Attorney, Agent, or Firm*—Davis Wright Tremaine LLP

(57) ABSTRACT

A sensing module operates with a sense amplifier sensing a conduction current of a memory cell via a coupled bit line under constant voltage condition in order to minimize bit-line to bit-line coupling. The rate of discharge of a dedicated capacitor as measured by a change in the voltage drop thereacross in a predetermined period is used to indicate the magnitude of the conduction current. The voltage cannot drop below a minimum level imposed by a circuit for maintaining the constant voltage condition on the bit line. A voltage shifter is used to boost the voltage during the discharge and to unboost the voltage after the discharge, so that the change in voltage drop properly reflects the rate of discharge without running into the minimum level.

16 Claims, 29 Drawing Sheets

U.S. PATENT DOCUMENTS

| | | |
|---|---|---|
| 5,093,806 A | 3/1992 | Tran |
| 5,095,344 A | 3/1992 | Harari |
| 5,172,338 A | 12/1992 | Mehrotra et al. |
| 5,245,571 A | 9/1993 | Takahashi |
| 5,313,421 A | 5/1994 | Guterman et al. |
| 5,315,541 A | 5/1994 | Harari |
| 5,343,063 A | 8/1994 | Yuan et al. |
| 5,418,752 A | 5/1995 | Harari et al. |
| 5,537,356 A | 7/1996 | Akaogi et al. |
| 5,555,203 A | 9/1996 | Shiratake et al. |
| 5,570,315 A | 10/1996 | Tanaka et al. |
| 5,595,924 A | 1/1997 | Yuan et al. |
| 5,650,970 A | 7/1997 | Kai |
| 5,661,053 A | 8/1997 | Yuan |
| 5,768,192 A | 6/1998 | Eitan |
| 5,774,397 A | 6/1998 | Endoh et al. |
| 5,806,082 A | 9/1998 | Shaw |
| 5,860,082 A | 1/1999 | Smith et al. |
| 5,872,739 A | 2/1999 | Womack |
| 5,886,919 A | 3/1999 | Morikawa et al. |
| 5,903,495 A | 5/1999 | Takeuchi et al. |
| 5,920,502 A | 7/1999 | Noda et al. |
| 5,949,720 A | 9/1999 | Brady |
| 5,978,271 A | 11/1999 | Sato et al. |
| 6,011,287 A | 1/2000 | Itoh et al. |
| 6,011,725 A | 1/2000 | Eitan |
| 6,046,935 A | 4/2000 | Takeuchi et al. |
| 6,046,940 A | 4/2000 | Takeuchi et al. |
| 6,061,270 A | 5/2000 | Choi |
| 6,062,270 A | 5/2000 | Hultberg et al. |
| 6,097,638 A | 8/2000 | Himeno et al. |
| 6,191,977 B1 | 2/2001 | Lee |
| 6,222,762 B1 | 4/2001 | Guterman et al. |
| 6,252,798 B1 | 6/2001 | Satoh et al. |
| 6,301,153 B1 | 10/2001 | Takeuchi et al. |
| 6,307,783 B1 | 10/2001 | Parker |
| 6,373,746 B1 | 4/2002 | Takeuchi et al. |
| 6,385,110 B1 | 5/2002 | Deguchi |
| 6,407,953 B1 | 6/2002 | Cleeves |
| 6,438,038 B2 | 8/2002 | Ikehashi et al. |
| 6,490,199 B2 | 12/2002 | Lee et al. |
| 6,504,757 B1 | 1/2003 | Hollmer et al. |
| 6,519,180 B2 | 2/2003 | Tran et al. |
| 6,522,592 B2 * | 2/2003 | Van De Graaff ............ 365/205 |
| 6,535,434 B2 | 3/2003 | Maayan et al. |
| 6,545,917 B2 | 4/2003 | Kim |
| 6,556,508 B2 | 4/2003 | Tsao et al. |
| 6,650,570 B2 | 11/2003 | Tanzawa et al. |
| 6,717,851 B2 | 4/2004 | Mangan et al. |
| 6,731,539 B1 | 5/2004 | Wong |
| 6,744,667 B2 | 6/2004 | Yamamoto et al. |
| 6,751,129 B1 | 6/2004 | Gongwer |
| 6,829,185 B2 | 12/2004 | Beer |
| 6,859,394 B2 | 2/2005 | Matsunaga et al. |
| 6,956,770 B2 | 10/2005 | Khalid et al. |
| 6,983,428 B2 | 1/2006 | Cernea et al. |
| 6,987,693 B2 | 1/2006 | Cernea et al. |
| 7,023,736 B2 | 4/2006 | Cernea et al. |
| 7,046,568 B2 | 5/2006 | Cernea |
| 7,064,980 B2 | 6/2006 | Cernea et al. |
| 7,212,445 B2 | 5/2007 | Cernea et al. |
| 2001/0006479 A1 | 7/2001 | Ikehashi et al. |
| 2002/0036925 A1 | 3/2002 | Tanzawa et al. |
| 2002/0039322 A1 | 4/2002 | Tran et al. |
| 2002/0118574 A1 | 8/2002 | Gongwer et al. |
| 2002/0126532 A1 | 9/2002 | Matsunaga et al. |
| 2004/0057285 A1 | 3/2004 | Cernea et al. |
| 2004/0057287 A1 | 3/2004 | Cernea et al. |
| 2004/0057318 A1 | 3/2004 | Cernea et al. |
| 2004/0060031 A1 | 3/2004 | Cernea et al. |
| 2004/0109357 A1 | 6/2004 | Cernea et al. |
| 2005/0057965 A1 | 3/2005 | Cernea et al. |
| 2005/0169082 A1 | 8/2005 | Cernea |
| 2006/0034121 A1 | 2/2006 | Khalid et al. |
| 2006/0158935 A1 | 7/2006 | Chan et al. |
| 2006/0158947 A1 | 7/2006 | Chan et al. |

FOREIGN PATENT DOCUMENTS

| | | |
|---|---|---|
| EP | 1164595 | 12/2001 |
| EP | 1 288 964 A | 3/2003 |
| EP | GB 2 332 766 A | 10/2004 |
| GB | EP 1 467 377 A | 6/1999 |
| WO | WO 02/069340 | 9/2002 |
| WO | WO 2004/029984 A | 4/2004 |
| WO | WO 2005/029502 A1 | 3/2005 |
| WO | WO 2006/065501 A1 | 6/2006 |

OTHER PUBLICATIONS

USPTO, "Notice of Allowance and Fee(s) Due," mailed in related U.S. Appl. No. 11/321,681 on Jun. 29, 2007, 18 pages.

USPTO, "Office Action," mailed in related U.S. Appl. No. 11/621,750 on Mar. 8, 2007, 10 pages.

USPTO, "Notice of Allowance," mailed in U.S. Appl. No. 10/254,830 on Nov. 9, 2006, 6 pages.

European Patent Office, "Office Action," mailed in European Patent Application No. 04 783 607.7 on Oct. 10, 2006, 1 page.

USPTO, "Office Action," mailed in related U.S. Appl. No. 10/254,830 on Jul. 12, 2006, 12 pages.

European Patent Office/International Searching Authority, "Notification of Transmittal of the International Preliminary Examination Report," mailed in related International Application No. PCT/US2004/029426 on Jun. 2, 2006, 8 pages.

EPO/ISA, "Notification of Transmittal of the International Search Report and the Written Opinion of the International Searching Authority, or the Declaration," mailed in related PCT/US2005/042854 on Apr. 20, 2006, 9 pages.

USPTO, "Office Action," mailed in related U.S. Appl. No. 10/254,898 on Apr. 14, 2006, 13 pages.

USPTO, "Office Action," mailed in related U.S. Appl. No. 11/235,985 on May 9, 2006, 10 pages.

ISA/European Patent Office, "Notification of Transmittal of the International Search Report and the Written Opinion of the International Searching Authority, or the Declaration", mailed in related PCT/US2004/029426 on Jan. 20, 2005, 12 pages.

EPO/ISA, "Notification of Transmittal of the International Search Report or the Declaration", mailed in PCT/US03/29603 Nov. 5, 2004, 7 pages.

"Communication Relating to the Results of the Partial International Search" in PCT/US03/29603, EPO International Searching Authority, Jul. 30, 2004, 2 pages.

European Patent Office (International Searching Authority), "Notification of Transmittal of the International Search Report or the Declaration", issued in corresponding PCT Application No. PCT/US03/29045 on Jul. 28, 2004, 6 pages.

International Search Report corresponding to PCT/US03/30133, International Searching Authority, European Patent Office, filed Sep. 18, 2003, 4 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

USPTO, "Notice of Allowance and Fee(s) Due," mailed in related U.S. Appl. No. 11/015,199 on Dec. 20, 2005, 11 pages.

USPTO, "Office Action," mailed in related U.S. Appl. No. 10/678,918 on Jan. 11, 2006, 10 pages.

USPTO, "Notice of Allowance and Fee(s) Due," mailed in related U.S. Appl. No. 10/667,222 on Dec. 30, 2005, 8 pages.

European Patent Office, "Office Action," mailed in European Patent Application No. 03 754 785.8 on Jul. 2, 2007, 4 pages.

EPO/ISA, "Notification of Transmittal of the International Search Report and the Written Opinion of the International Searching Authority, or the Declaration", mailed in corresponding PCT/US2006/062429 on Aug. 7, 2007, 14 pages.

USPTO, "Notice of Allowance and Fee(s) Due," mailed in related U.S. Appl. No. 11/321,681 on Sep. 6, 2007, 11 pages.
USPTO, "Notice of Allowance and Fee(s) Due," mailed in related U.S. Appl. No. 11/321,953 on Sep. 6, 2007, 10 pages.

USPTO, "Office Action," mailed in related U.S. Appl. No. 11/621,750 on Sep. 11, 2007, 7 pages.

* cited by examiner

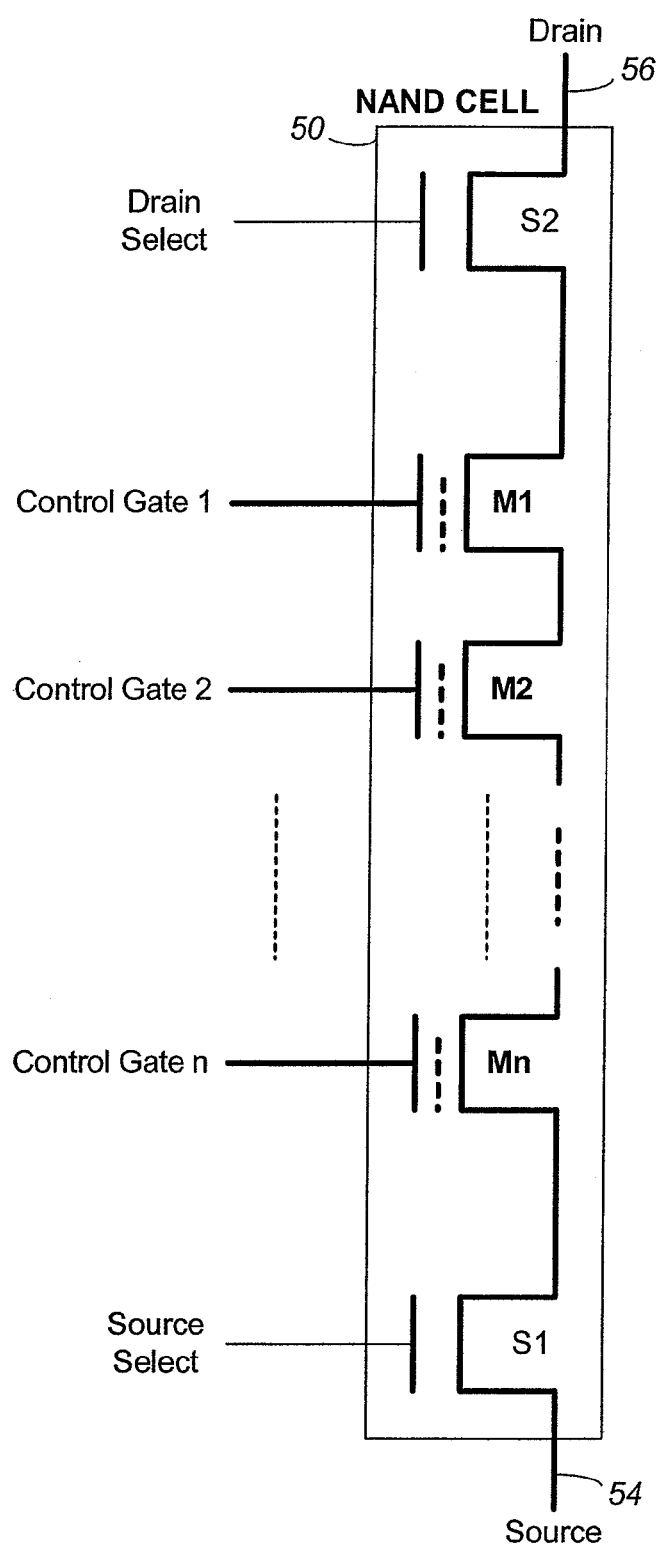
FIG. 1D *(Prior Art)*

MEMORY SENSING CIRCUIT AND METHOD FOR LOW VOLTAGE OPERATION

CROSS REFERENCE TO RELATED APPLICATIONS

This application is a continuation of U.S. patent application Ser. No. 11/015,199 filed on Dec. 16, 2004, now U.S. Pat. No. 7,046,568, which in turn is a continuation-in-part of U.S. patent application Ser. No. 10/665,828, filed on Sep. 17, 2003, now U.S. Pat. No. 7,023,736, which is a continuation-in-part of U.S. patent application Ser. No. 10/254,830, filed on Sep. 24, 2002, now U.S. Pat. No. 7,196,931, which applications are incorporated herein in their entirety by this reference.

FIELD OF THE INVENTION

This invention relates generally to non-volatile semiconductor memory such as electrically erasable programmable read-only memory (EEPROM) and flash EEPROM, and specifically ones having improved sensing circuits that operate with a low voltage supply.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1—left and T1—right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1—left is being accessed, both the T2 and T1—right are turned on to allow the current in the T1—left's portion of the channel to pass between the source and the drain. Similarly, when the storage unit T1—right is being accessed, T2 and T1—left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into a NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. Each memory transistor has a control gate for controlling read and write operations. A control gate of each of the select transistors S1, S2 provides control access to the NAND cell via its source terminal 54 and drain terminal 56 respectively.

When an addressed memory transistor within a NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903,495 and 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570, 315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level or $I_{REF}$, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current ID and the control gate voltage VCG for four different charges Q1-Q4 that the floating gate may be selectively storing at any one time. The four solid ID versus VCG curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 μA is used as shown, then the cell programmed with Q1 may be considered to be in a memory state "1" since its curve intersects with IREF in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to the memory elements in the array.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

As mentioned before, conventional memory devices improve read/write operations by operating in a massively parallel manner. This approach improves performance but does have repercussions on the accuracy of read and write operations.

One issue is the source line bias error. This is particular acute for memory architecture where a large number memory cells have their sources tie together in a source line to ground. Parallel sensing of these memory cells with common source results in a substantial current through the source line. Owing to finite resistance in the source line, this in turn results in an appreciable potential difference between the true ground and the source electrode of each memory cell. During sensing, the threshold voltage supplied to the control gate of each memory cell is relative to its source electrode but the system power supply is relative to the true ground. Thus sensing may become inaccurate due to the existence of the source line bias error.

Another issue has to do with bit line to bit line coupling or crosstalk. This problem becomes more acute with parallel sensing of closely spaced bit lines. A conventional solution to avoid bit line to bit line crosstalk is to sense either all even or all odd bit lines at a time while grounding the other bit lines. This architecture of a row consisting of two interleaved pages will help to avoid bit line crosstalk as well as to alleviate the problem of densely fitting the page of read/write circuits. A page decoder is used to multiplex the set of read/write modules to either the even page or the odd page. In this way, whenever one set of bit lines are being read or programmed, the interleaving set can be grounded to eliminate crosstalk between odd and even bit lines, but not between odd lines or even lines.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

Therefore there is a general need for high performance and high capacity non-volatile memory. In particular, there is a need to have a high capacity non-volatile memory with improved read and program performance that effectively manages the aforementioned problems.

SUMMARY OF INVENTION

These needs for a high capacity and high performance non-volatile memory device are met by having a large page of read/write circuits to read and write a corresponding page of memory cells in parallel. In particular, disturbance effects inherent in high density chip integration are that may introduce errors into reading and programming are either eliminated or minimized.

Source line bias is an error introduced by a non-zero resistance in the ground loop of the read/write circuits. The error is caused by a voltage drop across the resistance when current flows. According to one aspect of the invention, a method for reducing source line bias is accomplished by read/write circuits with features and techniques for multi-pass sensing. When a page of memory cells are being sensed in parallel, each pass helps to identify and shut down the memory cells with conduction current higher than a given demarcation current value. The identified memory cells are shut down by pulling their associated bit lines to ground.

In one implementation, the given demarcation current value is higher than the breakpoint current value for a conventional single-pass sensing. Alternatively, the given demarcation current value progressively converges to the breakpoint current value associated with a conventional single-pass sensing. In this way, sensing in subsequent passes will be less affected by source line bias since the total amount of current flow is significantly reduced by eliminating the contributions from the higher current cells.

According to one preferred embodiment, the current states are identified in a first pass by comparing each of their conduction currents with the given demarcation current value.

According to another preferred embodiment, the higher current states are identified in first pass by precharging each bit line with a controlled current source. This is accomplished by a precharge circuit acting as a controlled current source with the supplied current limited to the demarcation current value. In this way, memory cells with conduction currents that exceed the demarcation current value will drain away the current faster than the precharge circuit can charge up their associated bit lines. Thus, these high current memory cells are identified because their bit lines failed to be charged up and are then eliminated from participating in subsequent passes.

According to yet another preferred embodiment, the higher current states are identified by multiple passes that include comparison with a given demarcation current value and controlled precharging.

According to yet another preferred embodiment, a memory cell that has been detected with a higher current than a predetermined demarcation level does not necessarily have its bit line grounded immediately after detection. Instead, it is marked or enabled for grounding. Only, after the detection or sensing has been completed for all the memory cells of the page will all the marked or enabled bit lines be latched to ground. In this way, possible large voltage swings associated with the bit lines being latched to ground are confined to a period outside the sensing operation. This will minimize any disturbance effects of a bit line latching to ground on any memory cells of the page that is still undergoing sensing and detection.

Another error is caused by capacitive coupling between bit lines. According to another aspect of the present invention, a memory device and a method thereof allow sensing a plurality of memory cells in parallel while minimizing errors caused by bit-line to bit-line coupling or crosstalk. Essentially, the plurality of bit line being sensed in parallel has their bit line voltages controlled such that the voltage difference between each adjacent pair of bit lines is substantially independent of time while their conduction currents are being sensed. When this condition is imposed, all displacement currents due to the various bit lines' capacitance drop out since they all depend on a time varying voltage difference.

In a preferred embodiment this is accomplished by parallel sensing circuits that also ensure that the potential difference on any adjacent pair of connected bit lines is time-independent.

Prior art sensing includes determining the rate of the conduction current discharging the equivalent capacitor due to the bit line capacitance. This will contradict the present inventive feature of sensing at clamped bit line voltage.

According to another aspect of the present invention, a sensing circuit and method allow determination of a memory cell's conduction current by noting the rate it discharges or charges a given capacitor independent of the bit line. This will allow an optimum sensing circuit and method to be used, which are independent of the architecture of the memory array (i.e., independent of the bit line capacitance.) More importantly, it allows the bit line voltages to be clamped during sensing in order to avoid bit line crosstalk.

An error inherent in a non-volatile memory formed as a high density integrated circuit is due to coupling of the field from neighboring charge storage elements. Individual memory cells are not only affected by the field from their own storage element but also from that of neighboring cells. According to another aspect of the present invention, the errors due to the extraneous neighboring fields are minimized by minimizing the change in the field environment of each cell between programming and reading. This is accomplished by programming all adjacent memory cells in a page thereof together. Since the individual memory cells and their neighbors are programmed together, it will ensure a minimum change in field environment seen by the individual cells from the time they are programmed to the time they are read. In this way the error incurred during program verified is offset by a similar error during read, and the error is reduced and less data-dependent.

According to yet another aspect of the invention, a reference sense amplifier having characteristics representative of a population of sense amplifiers operating in parallel is used to track environment and systemic variations and control the population of sense amplifiers so that they are independent of these variations. Each of the population of sense amplifiers has predetermined properties dependent on a set common parameters and a set of control signals. The reference circuit, sharing a common environment with the population of sense amplifiers, is implemented to calibrate the set of common parameters with respect to the common environment and to generate the set of control signals accordingly so that each of the population of sense amplifiers is controlled to have its predetermined properties enforced.

According to yet another aspect of the invention, the conduction current of a memory cell is measured by the rate it discharges a dedicated capacitor in a sense amplifier capable of operating with a supply voltage under 2V.

In the preferred implementation, the rate is given by the change in voltage drop across the capacitor after a predetermined period. However, in the case when a voltage condition on an interconnecting bit line prevents the voltage drop extending beyond a predetermined minimum voltage limit, the dynamic range of the voltage drop will be reduced and is delimited by the voltage at the start of the discharge, which is typically the supply voltage Vdd, and the minimum voltage limit, $V_{LIMIT}$. A reference voltage, corresponding to a reference current for comparison would be set within this dynamic range. The reference voltage comparison is accomplished by providing a transistor with its gate turn-on voltage serving as the reference voltage. In the case of a p-transistor, the turn-on voltage is given by Vdd−$|V_{TP}|$ so that when the discharged voltage drops to or below this level, the p-transistor will be turned on or "tripped". For this turn-on voltage to lie within the dynamic range, the condition (Vdd−|$V_{TP}$|)>$V_{LIMIT}$ must be satisfied. However, when the supply voltage Vdd is reduced, two issues may arise. First, the reference voltage comparison is then made within a correspondingly reduced dynamic range. Secondly, a preferred trip point voltage may be outside this reduced dynamic range. For example, when Vdd is so low such that (Vdd−|$V_{TP}$|)<$V_{LIMIT}$, the p-transistor can never trip since the turn-on voltage is lower than $V_{LIMIT}$.

The invention provides a voltage shifting device to boost the discharging capacitor's voltage by a predetermined amount to increase the upper limit of the dynamic range by ΔV so as to have adequate dynamic range in the voltage drop to provide sufficient resolution when comparing with a reference voltage corresponding to a reference conduction current. After the predetermined period, the capacitor is decoupled from the memory cell in order to remove the $V_{LIMIT}$ restriction and the voltage drop is reduced by the same predetermined amount ΔV before being compared to the reference voltage (which could be lower than $V_{LIMIT}$). In this way, the sense amplifier can operate with a low supply voltage even when the reference voltage, such as (Vdd−|$V_{TP}$|) is lower than $V_{LIMIT}$.

In another embodiment, even in the case of adequate supply voltage, the voltage shifter can be implemented to provide an increased dynamic range within which a voltage comparison can be made to sense the conduction current of a memory cell.

In yet another embodiment, the supply voltage is detected to determine if it falls below a predetermined level, in which case the voltage shifter will be activated to allow proper functioning of the sense amplifier under low supply voltage conditions.

Additional features and advantages of the present invention will be understood from the following description of its preferred embodiments, which description should be taken in conjunction with the accompanying drawings.

BRIEF DESCRIPTION OF THE DRAWINGS

FIGS. 1A-1E illustrate schematically different examples of non-volatile memory cells.

DETAILED DESCRIPTION OF THE PREFERRED EMBODIMENTS

Figure 6A:
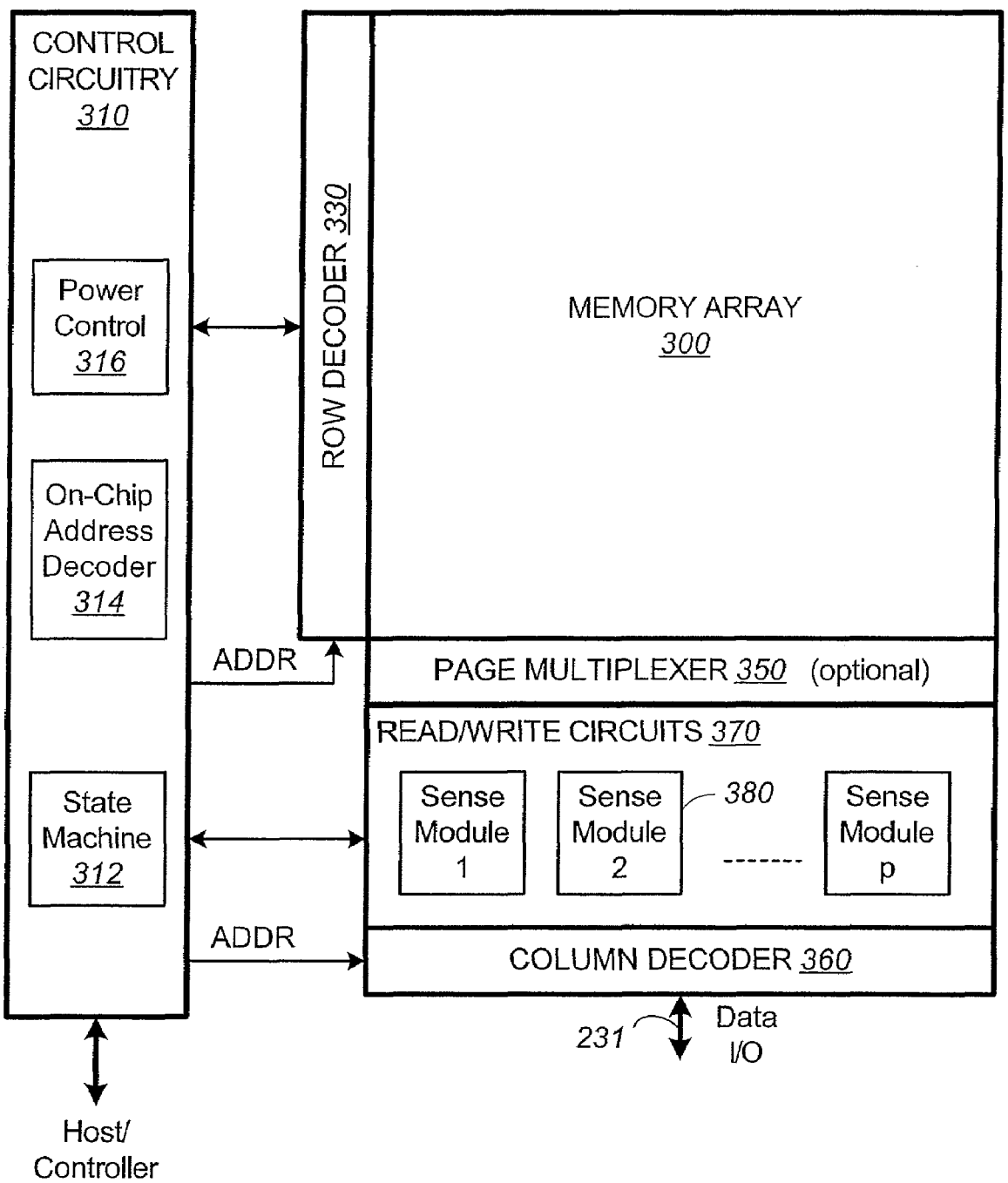
FIG. 6A illustrates schematically a memory device having read/write circuits for reading and programming a page of memory cells in parallel, according to one embodiment of the present invention.

FIG. 6A illustrates schematically a memory device having read/write circuits for reading and programming a page of memory cells in parallel, according to one embodiment of the present invention. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 include multiple sense modules 380 and allow a page of memory cells to be read or programmed in parallel. In one embodiment, where a row of memory cells are partitioned into multiple pages, a page multiplexer 350 is provided to multiplex the read/write circuits 370 to the individual pages.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 6B:
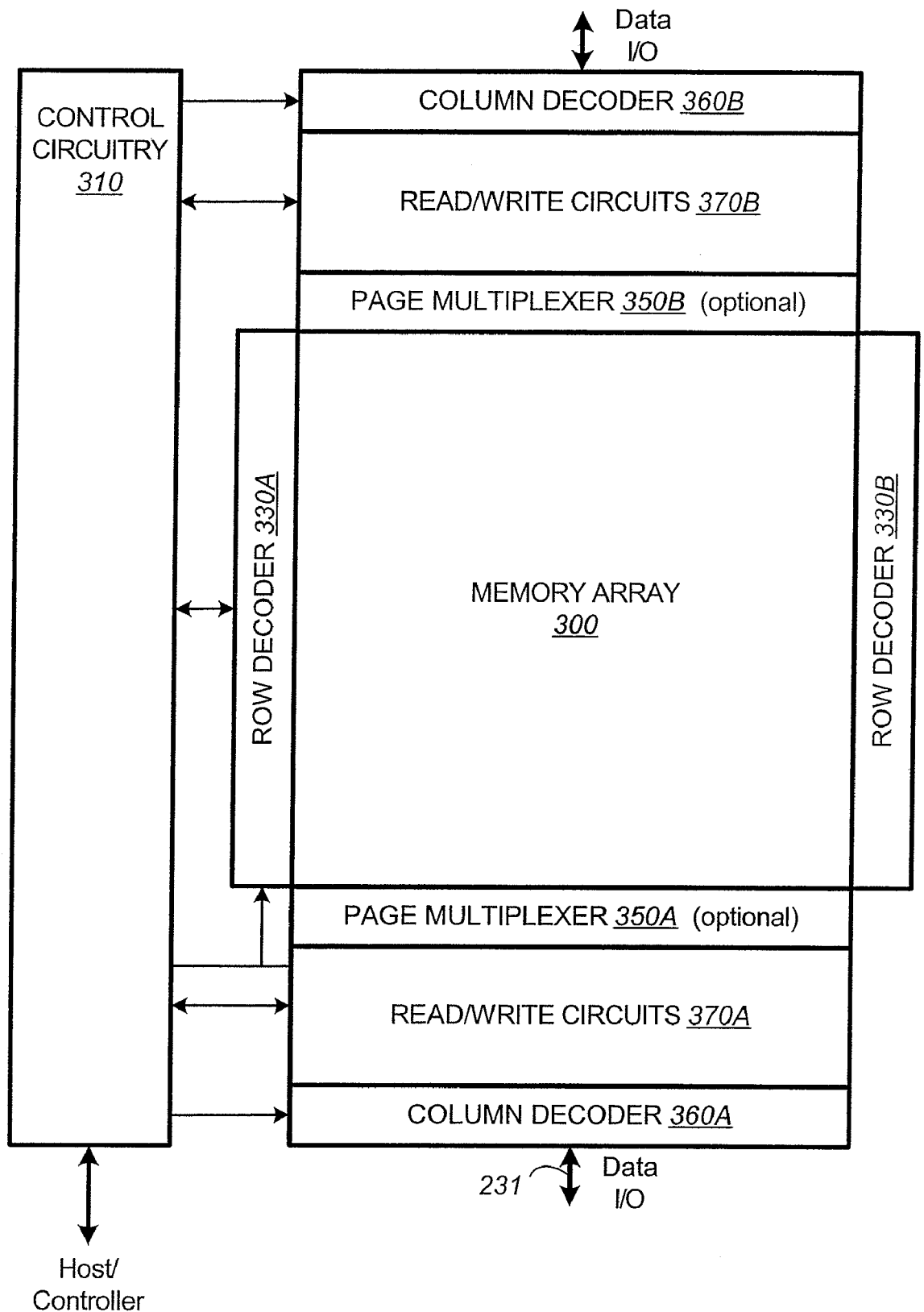
FIG. 6B illustrates a preferred arrangement of the memory device shown in FIG. 6A.

FIG. 6B illustrates a preferred arrangement of the compact memory device shown in FIG. 6A. Access to the memory array 300 by the various peripheral circuits is implemented in a symmetric fashion, on opposite sides of the array so that the densities of access lines and circuitry on each side are reduced in half. Thus, the row decoder is split into row decoders 330A and 330B and the column decoder into column decoders 360A and 360B. In the embodiment where a row of memory cells are partitioned into multiple pages, the page multiplexer 350 is split into page multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the sense modules 380, is essentially reduced by one half.

Source Line Error Management

One potential problem with sensing memory cells is source line bias. When a large number memory cells are sensed in parallel, their combine currents can result in significant voltage drop in a ground loop with finite resistance. This results in a source line bias which causes error in a read operation employing threshold voltage sensing.

Figure 7A:
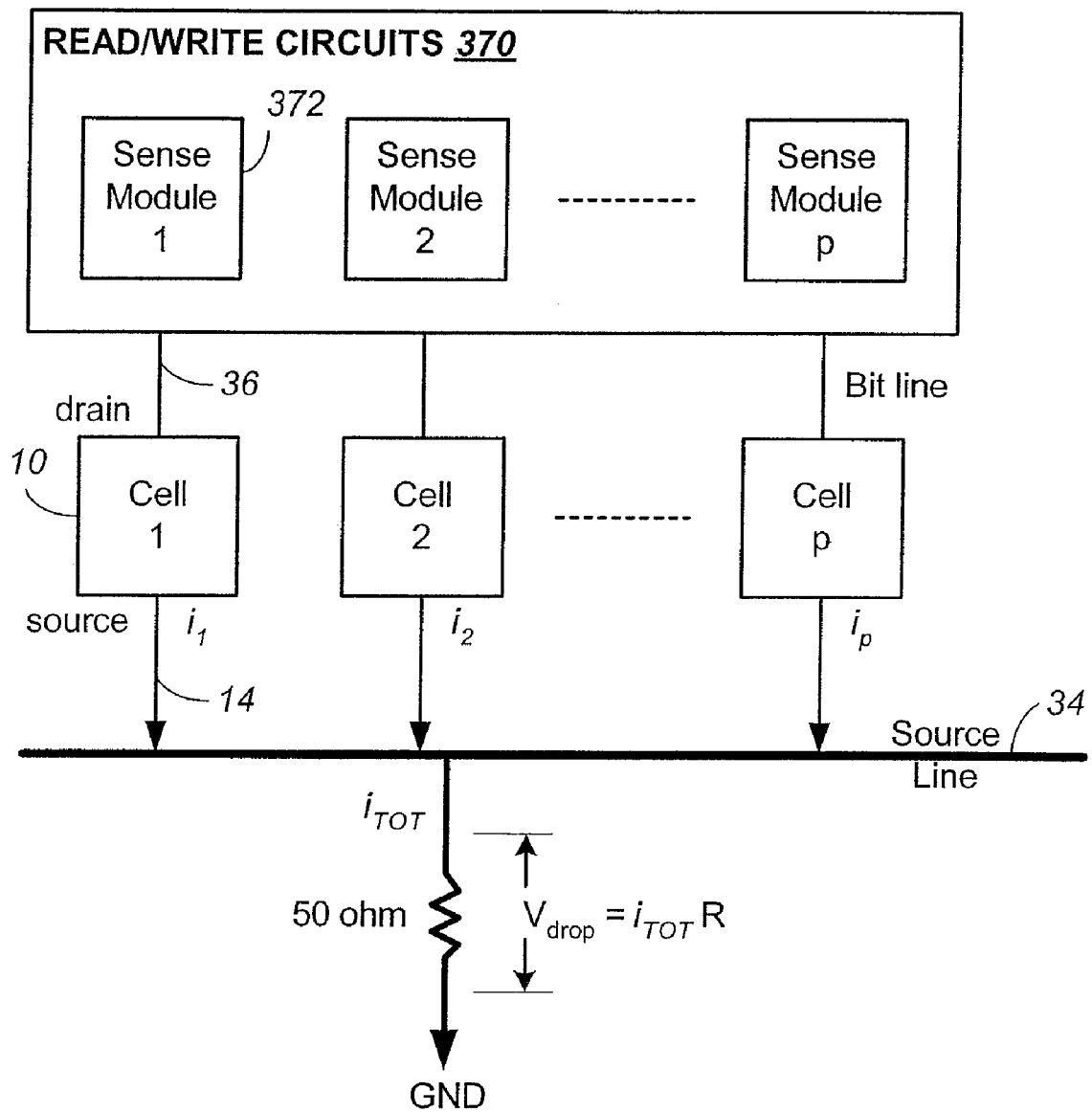
FIG. 7A illustrates the problem of source voltage error due to current flow in the source line having a finite resistance to ground.

FIG. 7A illustrates the problem of source voltage error due to current flow in the source line having a finite resistance to ground. The read/write circuits 370 operate on a page of memory cells simultaneously. Each sense modules 380 in the read/write circuits is coupled to a corresponding cell via a bit line 36. For example, a sense module 380 senses the conduction current $i_1$ (source-drain current) of a memory cell 10. The conduction current flows from the sense module through the bit line 36 into the drain of the memory cell 10 and out from the source 14 before going through a source line 34 to ground. In an integrated circuit chip, the sources of the cells in a memory array are all tied together as multiple branches of the source line 34 connected to some external ground pad (e.g. Vss pad) of the memory chip. Even when metal strapping is used to reduce the resistance of the source line, a finite resistance, R, remains between the source electrode of a memory cell and the ground pad. Typically, the ground loop resistance R is around 50 ohm.

Figure 1A:
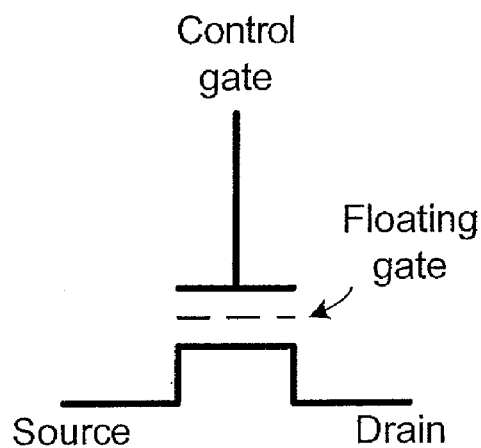
Figure 1B:
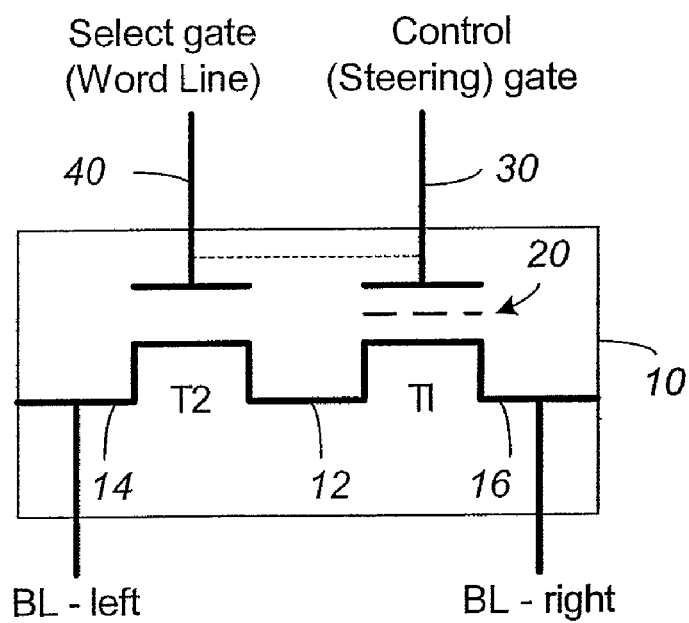
Figure 1C:
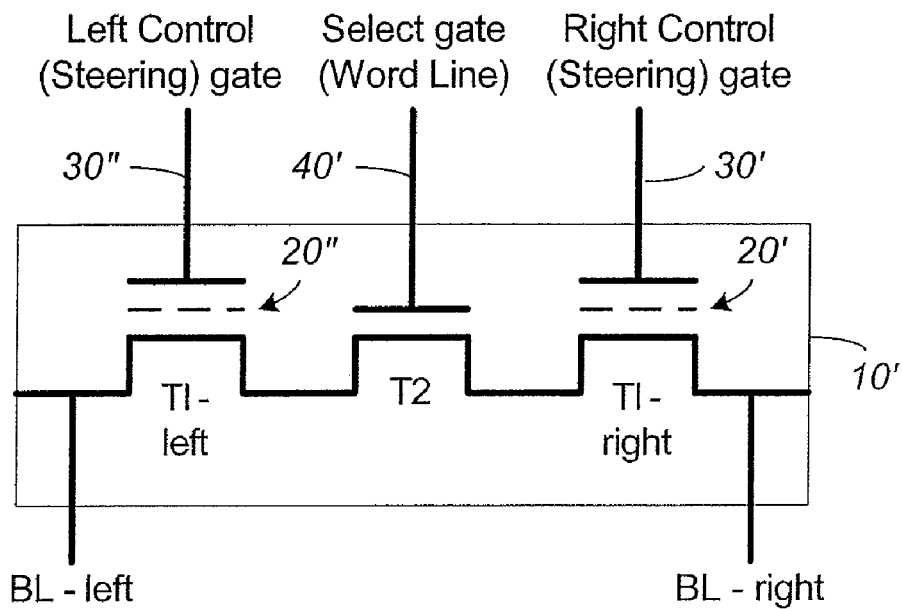
Figure 1E:
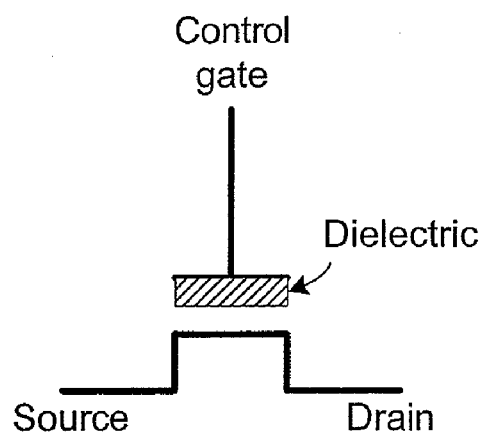
Figure 2:
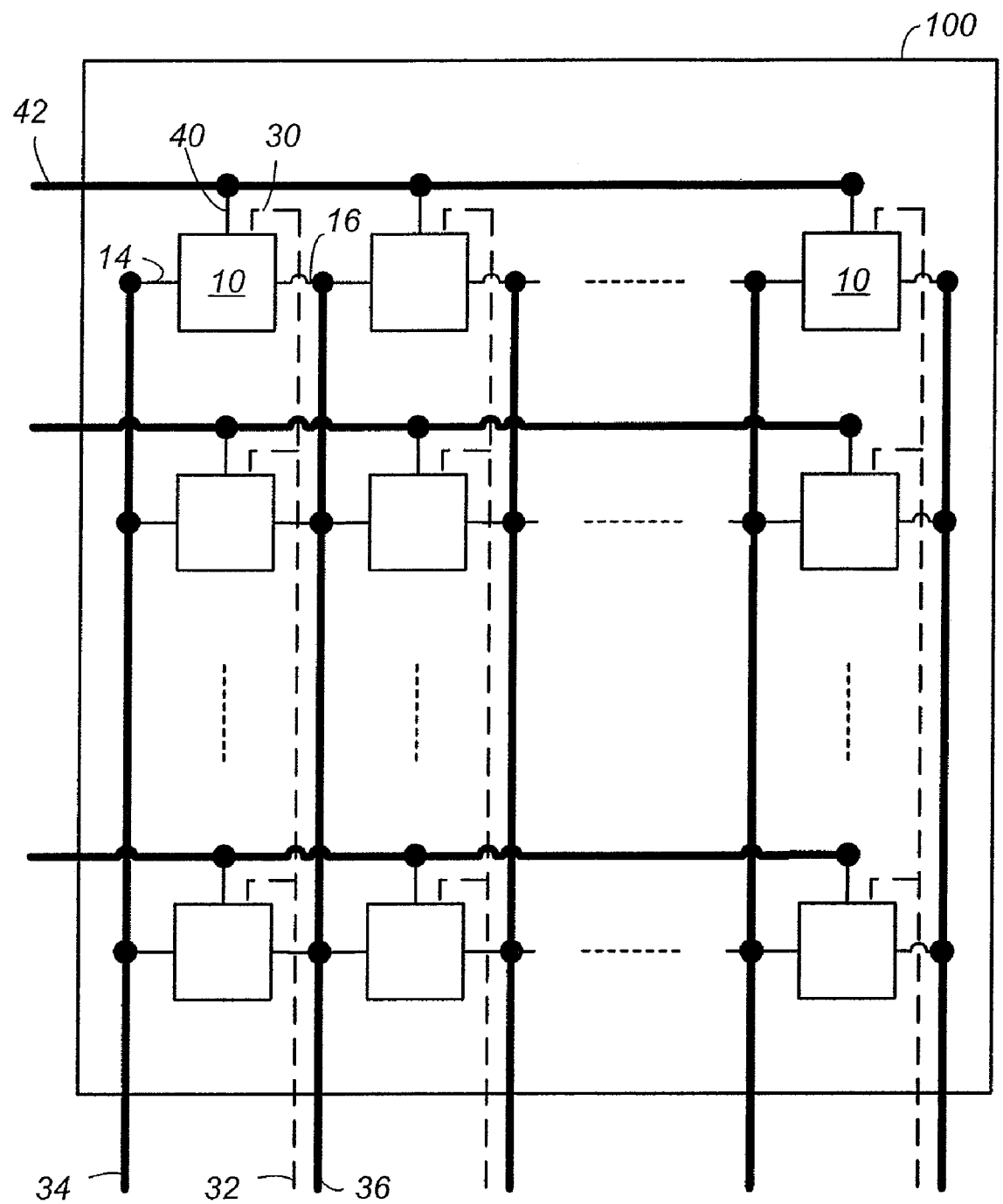
FIG. 2 illustrates an example of an NOR array of memory cells.
Figure 3:
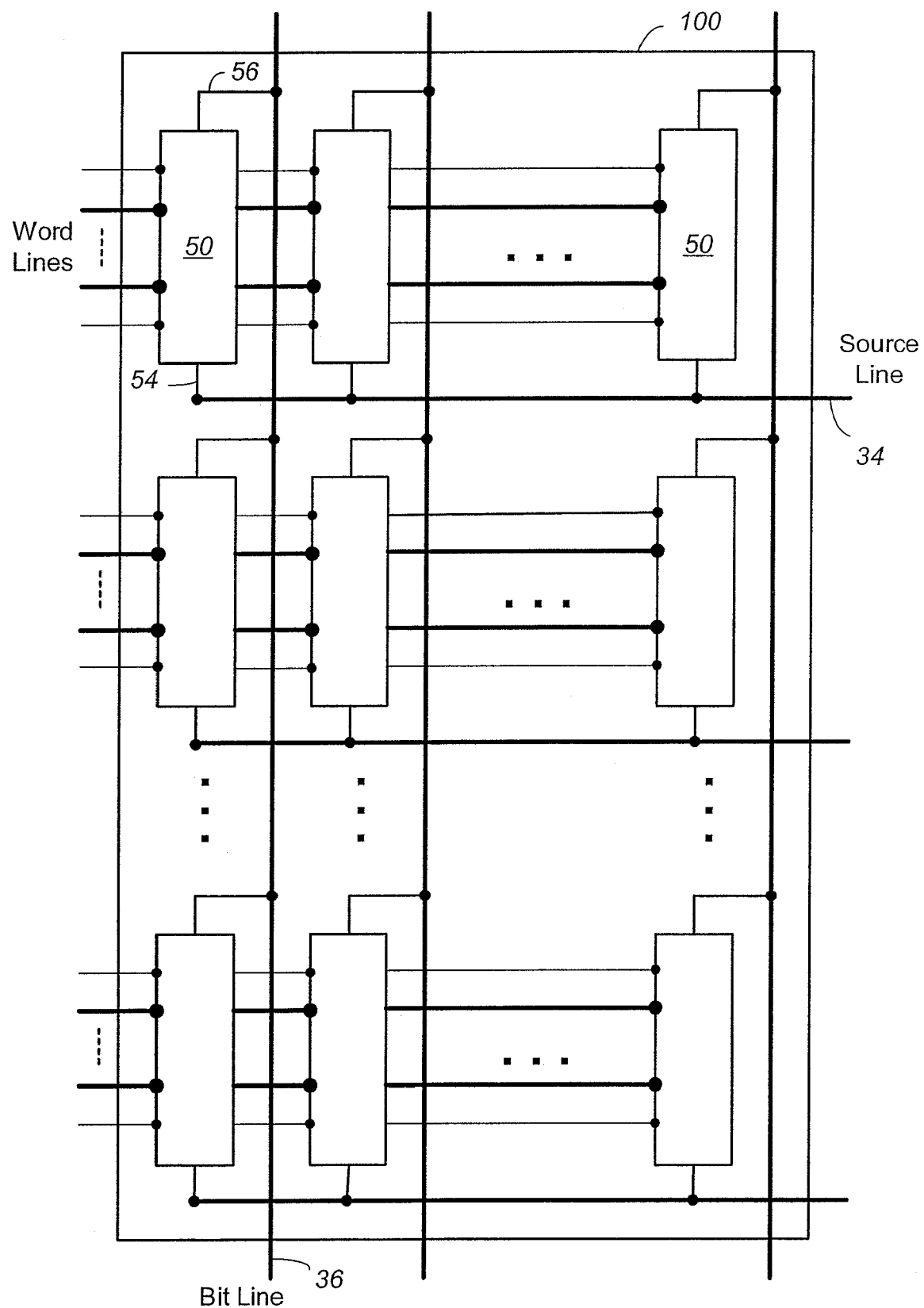
FIG. 3 illustrates an example of an NAND array of memory cells, such as that shown in FIG. 1D.
Figure 4:
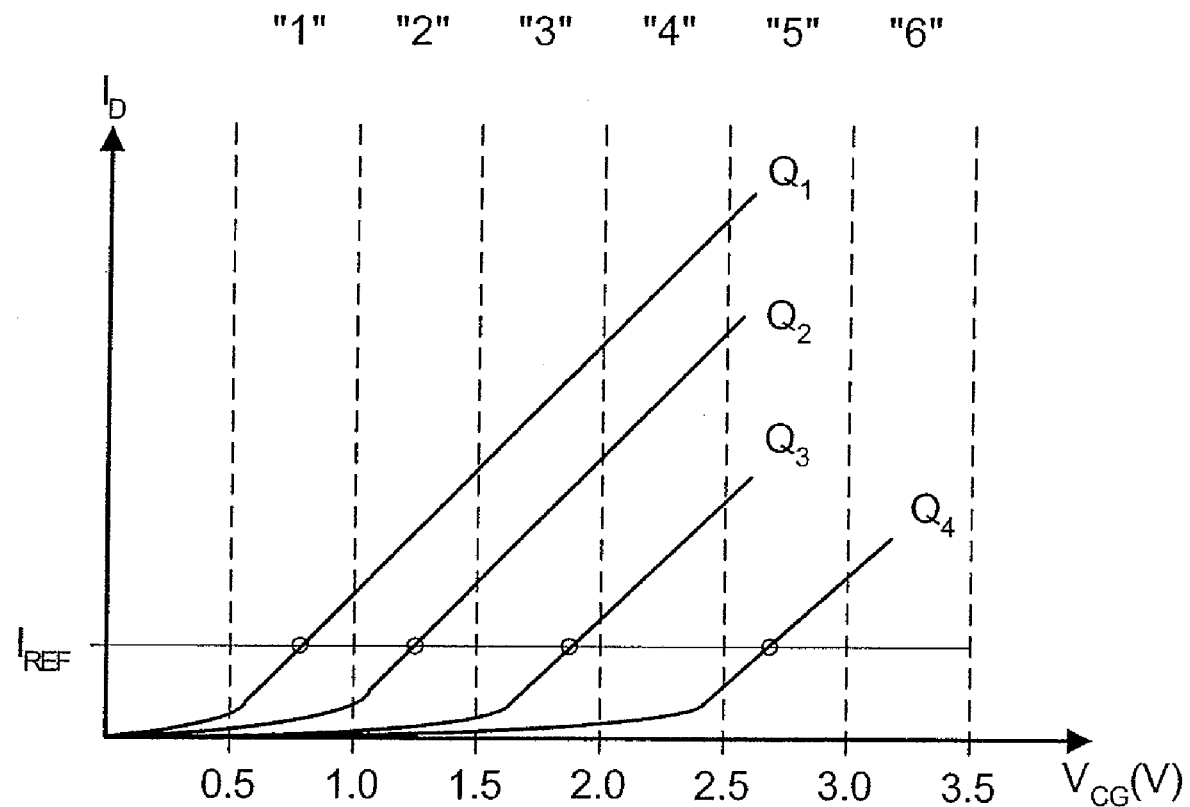
FIG. 4 illustrates the relation between the source-drain current and the control gate voltage for four different charges Q1-Q4 that the floating gate may be storing at any one time.
Figure 5:
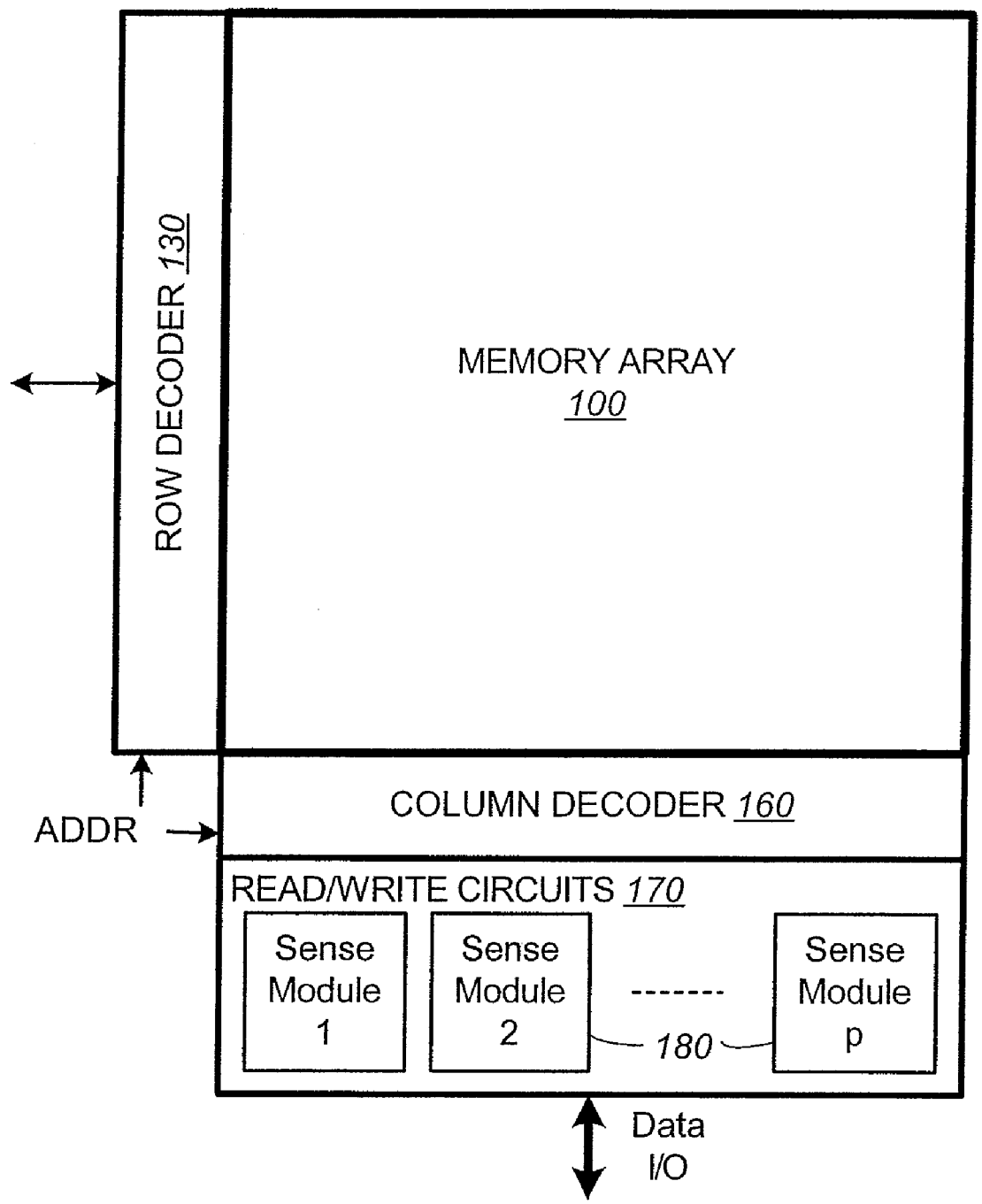
FIG. 5 illustrates schematically a typical arrangement of a memory array accessible by read/write circuits via row and column decoders.

For the entire page of memory being sensed in parallel, the total current flowing through the source line 34 is the sum of all the conduction currents, i.e. $i_{TOT}=i_1+i_2+\ldots,+i_p$. Generally each memory cell has a conduction current dependent on the amount of charge programmed into its charge storage element. For a given control gate voltage of the memory cell, a small charge will yield a comparatively higher conduction current (see FIG. 4.) When a finite resistance exists between the source electrode of a memory cell and the ground pad, the voltage drop across the resistance is given by $V_{drop}=i_{TOT} R$.

For example, if 4,256 bit lines discharge at the same time, each with a current of 1 μA, then the source line voltage drop will be equal to 4000 lines×1 μA/line×50 ohms~0.2 volts. This source line bias will contribute to a sensing error of 0.2 volts when threshold voltages of the memory cells are sensed.

Figure 7B:
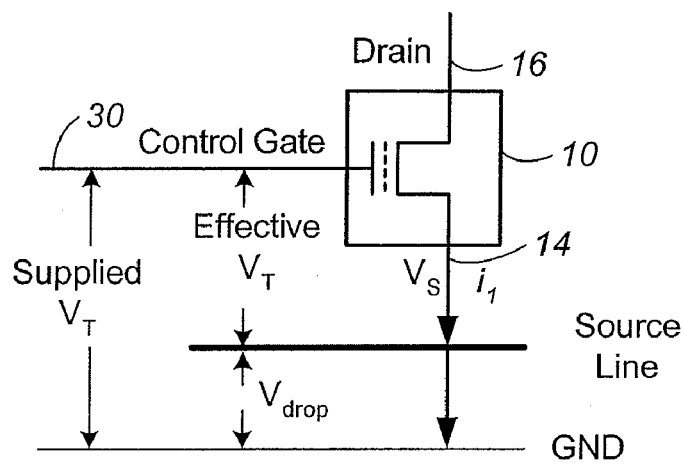
FIG. 7B illustrates the error in the threshold voltage level of a memory cell caused by a source line voltage drop.

FIG. 7B illustrates the error in the threshold voltage level of a memory cell caused by a source line voltage drop. The threshold voltage $V_T$ supplied to the control gate 30 of the memory cell 10 is relative to GND. However, the effective $V_T$ seen by the memory cell is the voltage difference between its control gate 30 and source 14. There is a difference of approximately $V_{drop}$ between the supplied and effective $V_T$ (ignoring the smaller contribution of voltage drop from the source 14 to the source line.) This $V_{drop}$ or source line bias will contribute to a sensing error of, for example 0.2 volts when threshold voltages of the memory cells are sensed. This bias cannot be easily removed as it is data-dependent, i.e., dependent on the memory states of the memory cells of the page.

According to one aspect of the invention, a method for reducing source line bias is accomplished by read/write circuits with features and techniques for multi-pass sensing. Each pass helps to identify and shut down the memory cells with conduction current higher than a given demarcation current value. Typically with each pass, the given demarcation current value progressively converges to the breakpoint current value for a convention single pass sensing. In this way, sensing in subsequent passes will be less affected by source line bias since the higher current cells have been shut down.

Figure 8:
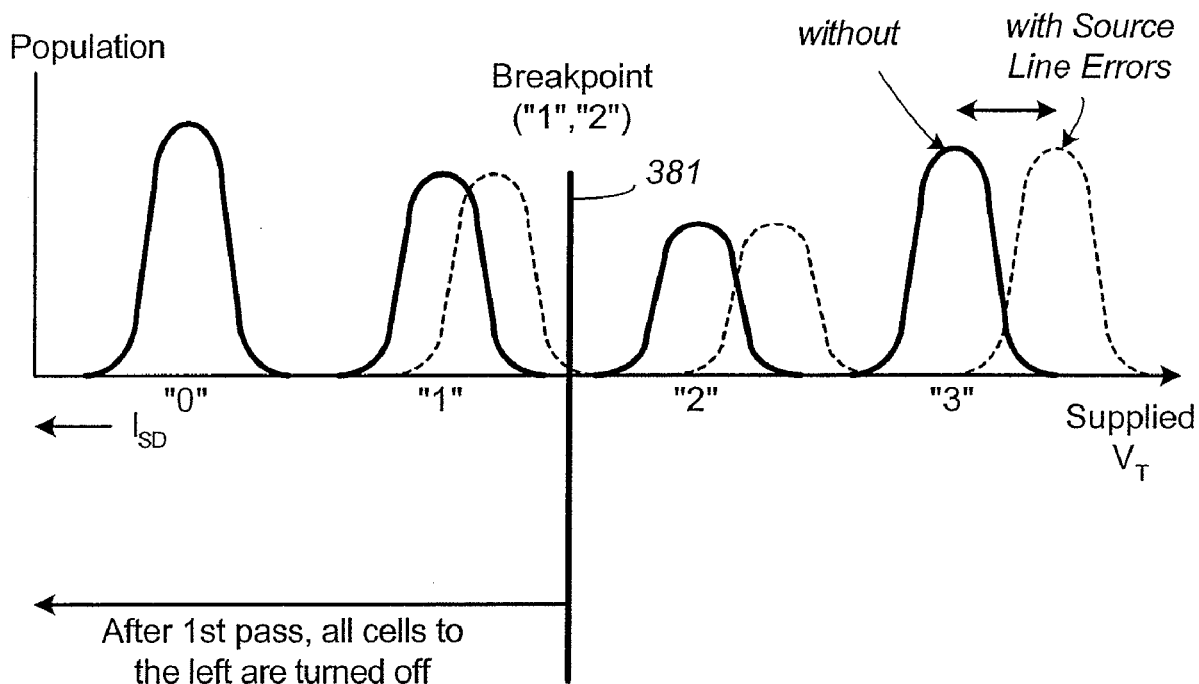
FIG. 8 illustrates an example population distribution of a page of memory cells for a 4-state memory.

FIG. 8 illustrates an example population distribution of a page of memory cells for a 4-state memory. Each cluster of memory state is programmed within a range of conduction currents $I_{SD}$ clearly separated from each other. For example, a breakpoint 381 is a demarcating current value between two clusters, respectively representing the "1" and "2" memory states. In a conventional single-pass sensing, a necessary condition for a "2" memory state will be that it has a conduction current less than the breakpoint 381. In FIG. 8, if there were no source line bias, the population distribution with respect to the supplied threshold voltage $V_T$ will be given by the curve with the solid line. However, because of the source line bias error, the threshold voltage of each of the memory cells at its control gate is increased by the source line bias. This means a higher control gate voltage need be applied to compensate for the bias. In FIG. 8, the source line bias results in a shifting of the distribution (broken line) towards a higher supplied $V_T$. The shifting will be more for that of the higher (lower current) memory states. If the breakpoint 381 is designed for the case without source line error, then the existence of a source line error will have some of the tail end of "1" states having conduction currents to appear in a region of no conduction, which means higher than the breakpoint 381. This will result in some of the "1" states (more conducting) being mistakenly demarcated as "2" states (less conducting.)

For example, the present multi-pass sensing can be implement in two passes (j=1 to 2). After the first pass, those memory cells with conduction currents higher than the breakpoint 381 are identified and removed by turning off their conduction current. A preferred way to turn off their conduction currents is to set their drain voltages on the bit lines to ground. Referring also to FIG. 7A, this will effective remove all the higher current states demarcated by the breakpoint 381, resulting in a much reduced $i_{TOT}$ and therefore a much reduced $V_{drop}$. In a second pass (j=2), because of the removal of the high current states that contributed to the source line bias, the distribution with the broken line approaches that of the one with the solid line. Thus sensing using the breakpoint 381 as the demarcation current value will not result in mistaking the "1" states for the "2" states.

As compared to a conventional one-pass approach, the present two-pass method substantially reduces the likelihood of misidentifying some of the "1" cells as "2" or higher cells. More than two passes are also contemplated, although there will be diminishing returns with increasing number of passes. Further each pass may have the same demarcation current, or with each successive pass, the demarcation current used converges to that of a breakpoint normally used in a conventional single pass sensing.

Figure 9:
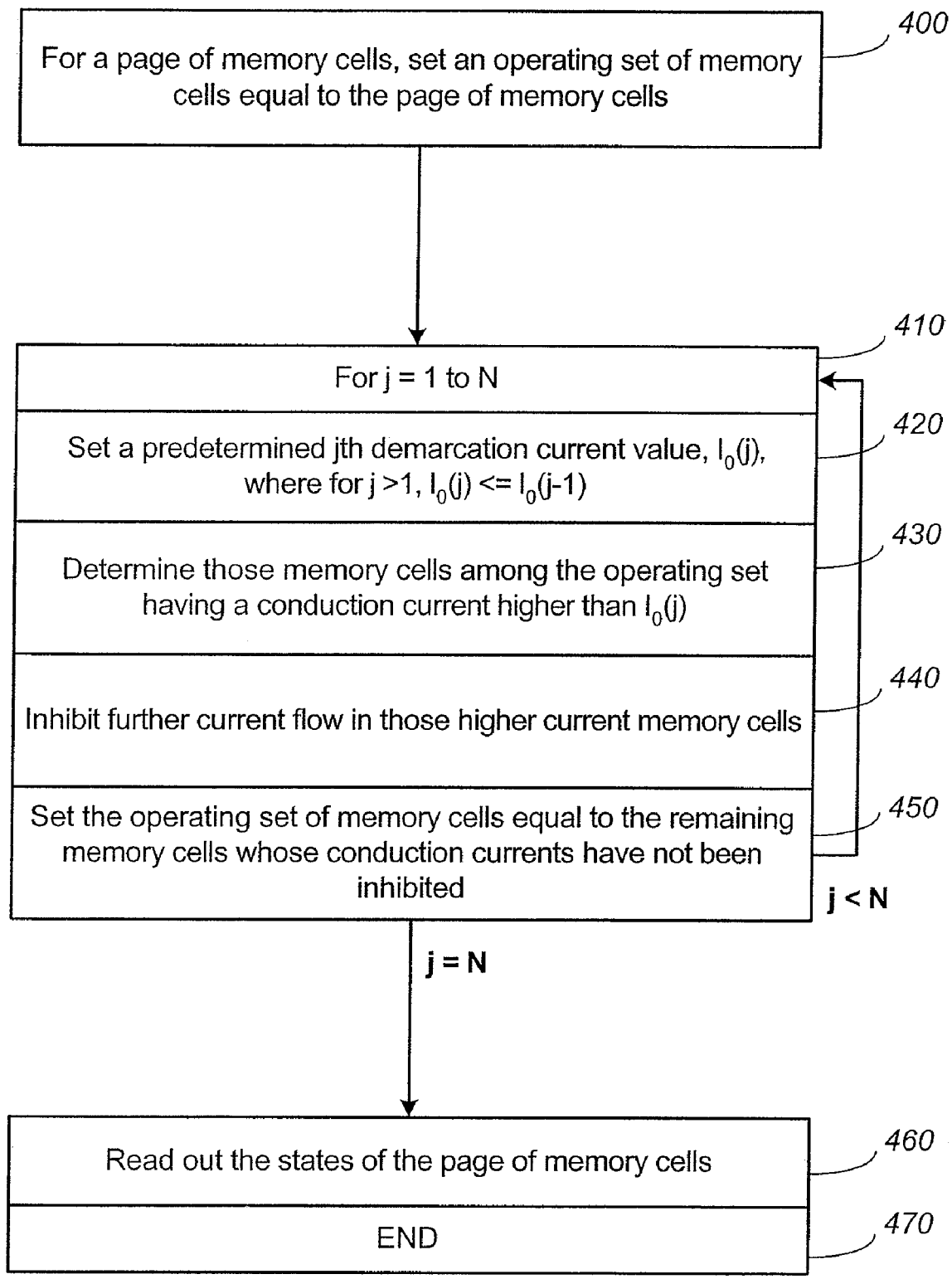
FIG. 9 is a flow diagram showing a multi-pass sensing method for reducing source line bias, according to one embodiment of the invention.

FIG. 9 is a flow diagram showing a multi-pass sensing method for reducing source line bias, according to one embodiment of the invention.

STEP 400: For a page of memory cells, initially set an operating set of memory cells equal to the page of memory cells.

STEP 410: Begin the multi-pass j=1 to N.

STEP 420: Set a demarcation current value, $I_0(j)$, where after the first pass j>1, $I_0(j)$ is less than or equal that of a previous pass j−1, i.e. $I_0(j)<=I_0(j-1)$.

STEP 430: Determine those memory cells among the operating set having a conduction current higher than the demarcation current value $I_0(j)$.

STEP 440: Inhibit further current flow in those memory cells with a conduction current higher than the demarcation current value $I_0(j)$.

STEP 450: Set the operating set of memory cells equal to the remaining memory cells whose conduction currents have not been inhibited. If j<N, return to STEP 410, otherwise proceed to STEP 460.

STEP 460: Read out the states of the page of memory cells.

STEP 470: End.

Figure 10:
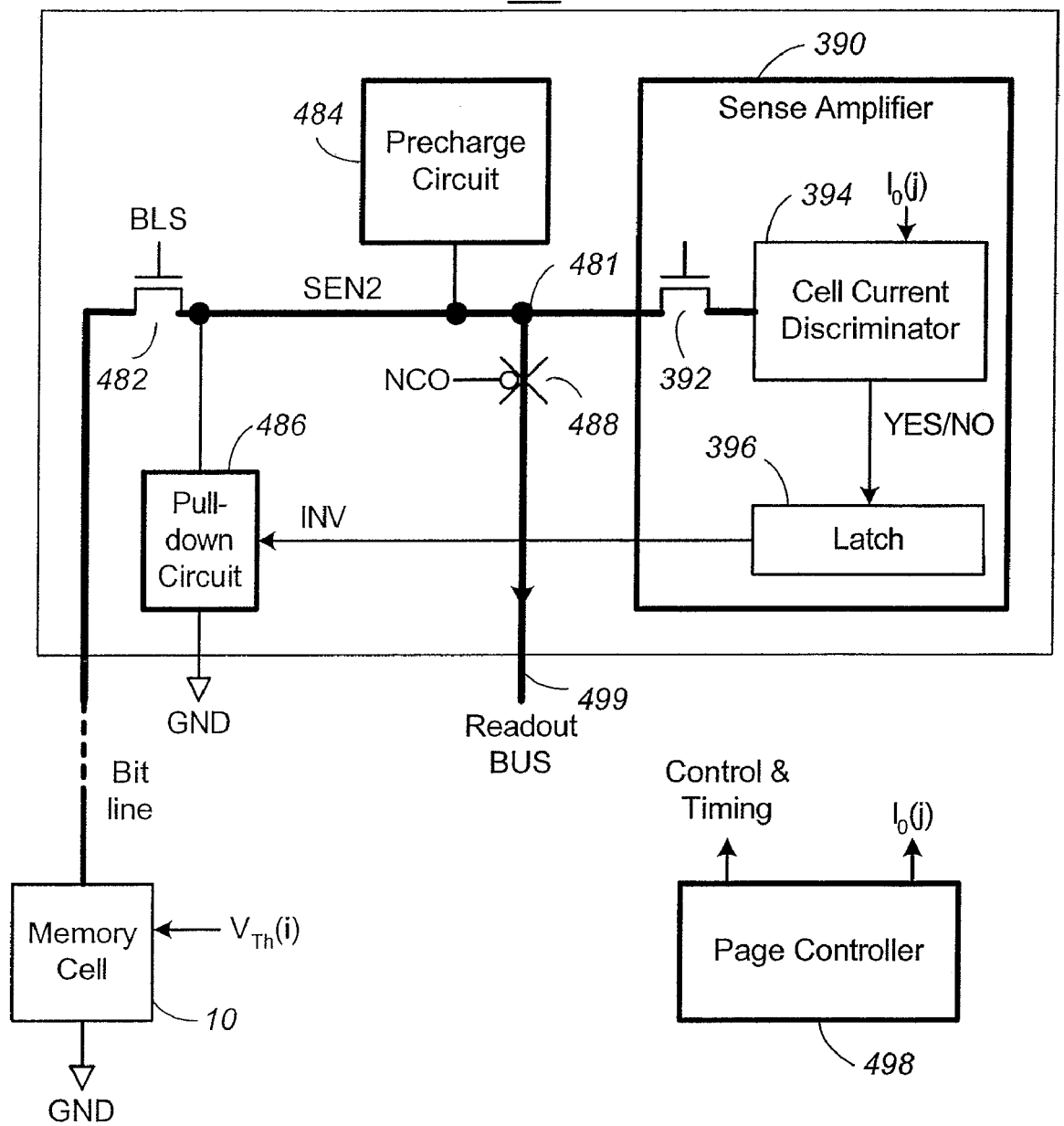
FIG. 10 is a schematic diagram illustrating a multi-pass sense module, according to a preferred embodiment of the invention.

FIG. 10 is a schematic diagram illustrating a multi-pass sense module, according to a preferred embodiment of the invention. The multi-pass sense module 380 senses the conduction current of a memory cell 10 via a coupled bit line 36. It has a sense node 481 that can be selectively connected a number of components. Initially, an isolation transistor 482, when enabled by a signal BLS connects the bit line 36 to the sense node 381. A precharge circuit 484 is coupled to the sense node 481. When the precharged circuit 484 is enabled, it brings the bit line voltage to a predetermined drain voltage appropriate for sensing. At the same time, the control gate of the memory cell is set to a predetermined threshold voltage $V_T(i)$ for a given memory state under consideration. This will induce a source-drain conduction current to flow in the memory cell 10, which may be sensed from the coupled bit line 36. The conduction current is a function of the charge programmed into the memory cell and the applied $V_T(i)$ when there exists a nominal voltage difference between the source and drain of the memory cell.

A sense amplifier 390 is then connected to the sense node to sense the conduction current in the memory cell 10. A cell current discriminator 394 serves as a discriminator or comparator of current levels. It determines whether the conduction current is higher or lower than a given demarcation current value $I_0(j)$. If it is higher, a latch 396 is set to a predetermined state. A pull-down circuit 486 is activated in response to the latch 396 being set to the predetermined state, e.g., with INV being HIGH. This will pull down the sense node 481 and therefore the connected bit line 36 to ground voltage. This will inhibit the conduction current flow in the memory cell 10 irrespective of the control gate voltage since there will be no voltage difference between its source and drain.

In general, there will be a page of memory cells being operated on by a corresponding number of multi-pass sense modules 380. A page controller 498 supplies control and timing signals to each of the sense modules. In one embodiment, the page controller 498 is implemented as part of the state machine 312 in the control circuitry 310 shown in FIG. 6A. In another embodiment, the page controller is part of the read/write circuits 370. The page controller 498 cycles each of the multi-pass sense module 380 through a predetermined number of passes (j=1 to N) and also supplies a predetermined demarcation current value $I_0(j)$ for each pass. As will be seen in connection with FIG. 13 later, the demarcation current value can also be implemented as a time period for sensing. After the last pass, the page controller 498 enables a transfer gate 488 with a signal NCO to read the state of the sense node 481 as sensed data to a readout bus 499. In all, a page of sense data will be read out from all the multi-pass modules 380.

Figure 11:
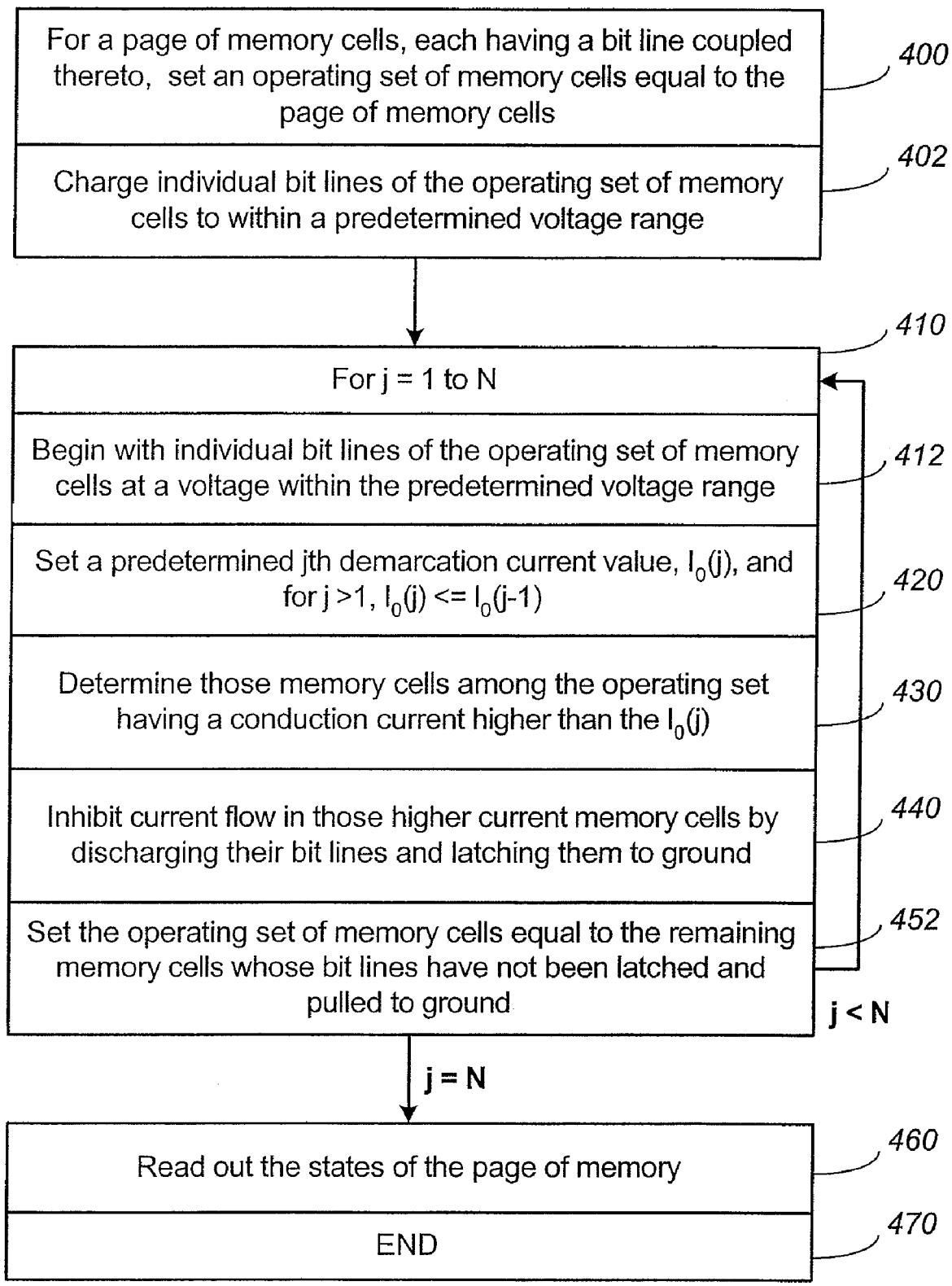
FIG. 11 is a flow diagram showing the operation of the multi-pass sense module of FIG. 10.

FIG. 11 is a flow diagram showing the operation of the multi-pass sense module of FIG. 10.

STEP 400: For a page of memory cells each having a bit line coupled to it, initially set an operating set of memory cells equal to the page of memory cells.

STEP 402: Charge individual bit lines of the operating set of memory cells to within a predetermined voltage range.

STEP 410: Begin the multi-pass j=1 to N.

STEP 412: Begin with individual bit lines of the operating set of memory cells at a voltage within the predetermined voltage range.

STEP 420: Set a demarcation current value, $I_0(j)$, where after the first pass j>1, $I_0(j)$ is less than or equal that of a previous pass j−1, i.e. $I_0(j)<=I_0(j-1)$.

STEP 430: Determine those memory cells among the operating set having a conduction current higher than the demarcation current value $I_0(j)$.

STEP 440: Inhibit further current flow in those memory cells with a conduction current higher than the demarcation current value $I_0(j)$.

STEP 452: Set the operating set of memory cells equal to the remaining memory cells whose bit lines have not been latched and pulled to ground. If j<N, return to STEP 410, otherwise proceed to STEP 460.

STEP 460: Read out the states of the page of memory cells.

STEP 470: End.

Sensing with Control of Bit Line to Bit Line Coupling

Figure 12:
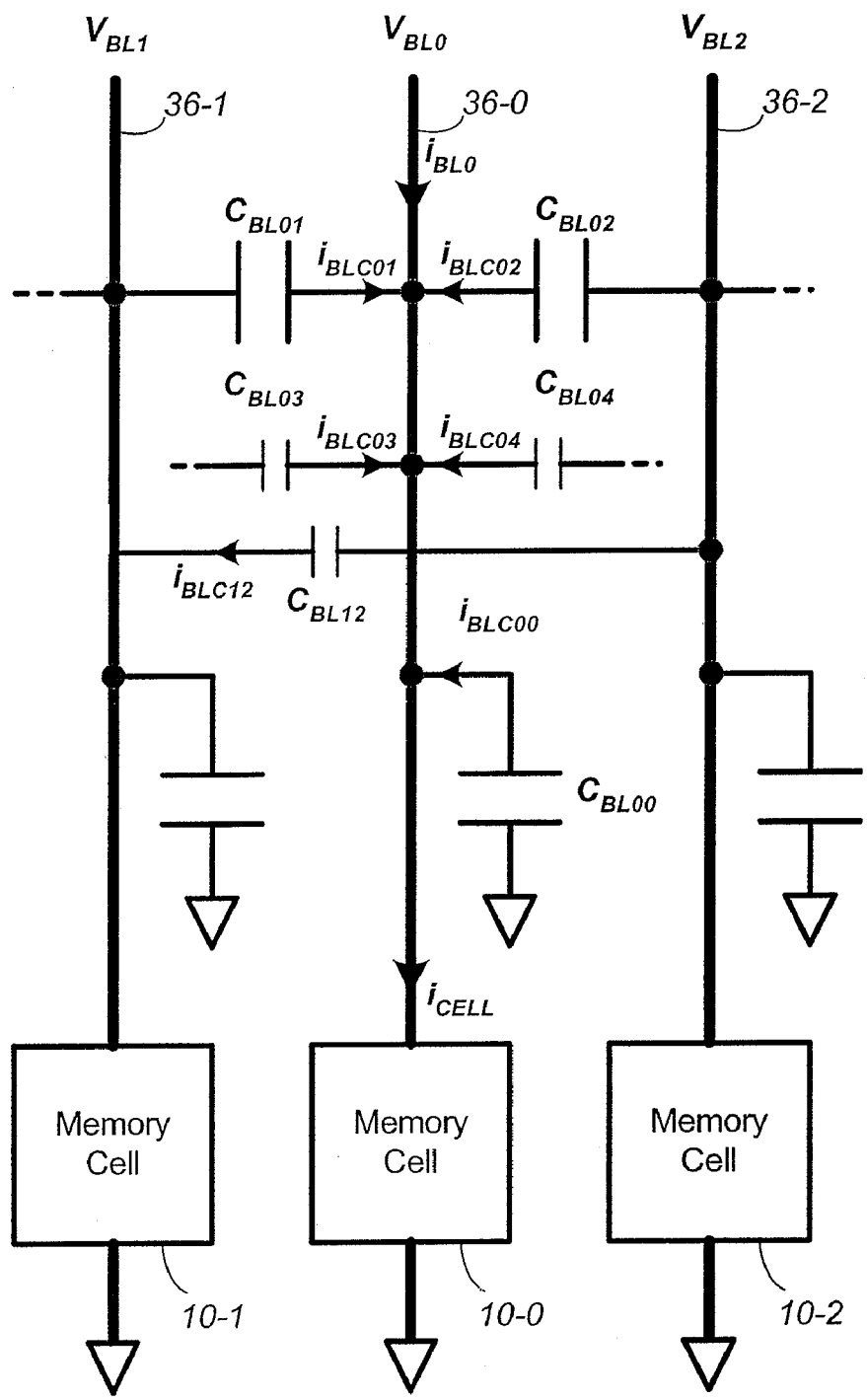
FIG. 12 illustrates three adjacent bit lines and the effect of capacitive couplings between them.

FIG. 12 illustrates three adjacent bit line and the effect of capacitive couplings between them. A memory cell 10-0 has two adjacent memory cells, 10-1 and 10-2. Similarly, coupled to the three memory cells are respectively three adjacent bit lines 36-0, 36-1 and 36-2. Each of the bit lines has its own self capacitance $C_{BL0}$, $C_{BL1}$ and $C_{BL2}$ respectively. The pair of adjacent bit lines 36-0 and 36-1 has mutual capacitance $C_{BL01}$. The pair of adjacent bit lines 36-0 and 36-1 has mutual capacitance $C_{BL02}$.

It can then be seen, there could be various branches of current flow due to the various capacitances. In particular, the currents due to each bit line self capacitance will result in:

$i_{BLC0} = C_{BL0} d/dt V_{BL0}$, $i_{BLC1} = C_{BL1} d/dt V_{BL1}$ $i_{BLC2} = C_{BL2} d/dt V_{BL2}$

Similarly, the cross current due to the pair of adjacent bit lines 36-0 and 36-1 is:

$$i_{BLC01} = C_{BL01} d/dt(V_{BL0}-V_{BL1}), \text{ and}$$

$$i_{BLC02} = C_{BL02} d/dt(V_{BL0}-V_{BL2}).$$

For the memory cell 10-0, the cell's conduction current is:

$$i_{CELL} \sim i_{BL0} + [i_{BLC00} + i_{BLC01} + i_{BLC02}].$$

The cell current given above is an approximation since it only includes contributions from adjacent bit lines. In general, for the bit line BL0 there will also be capacitance $C_{BL03}$ due to the non adjacent bit lines to the left as well as capacitance $C_{BL04}$ due to the non adjacent bit lines to the right. Similarly, there will be a mutual capacitance $C_{BL12}$ between non adjacent bit lines BL1 and BL2. These capacitance will contribute to displacement current flow dependent on a varying voltage across each capacitor. It has been estimated that the contributions from non adjacent bit lines amount to about ten percent of the contribution from the adjacent bit lines.

Also, since the sense module 380 is coupled to the bit line (see FIG. 10), the current it detected is $I_{BL0}$, which is not identical to $i_{CELL}$, because of the current contributions from the various bit line capacitances.

One prior art solution is to sense a memory cell while grounding the bit lines of adjacent cells. The conduction current in the memory cell is sensed by noting the rate of discharge through the capacitance of the coupled bit line. Thus, the conduction current can be derived from the rate of change of the bit line voltage. Referring to FIG. 12, this means that while the conduction current on the bit line BL0 36-0 is being sensed, the voltage $V_{BL1}$ on adjacent bit line BL1 36-1 and $V_{BL2}$ on adjacent bit line BL2 36-2 are set to zero. By shutting down the currents in adjacent bit lines, the crosstalk between adjacent bit lines is eliminated. However, since this prior art sensing results in a time varying $V_{BL0} = V_{BL0}(t)$, and by the equations given above, the self-capacitance of BL0 with respect to ground becomes $C_{BL00} + C_{BL01} + C_{BL02}$. This prior art sensing also does not eliminate displacement currents contributed from the non adjacent bit lines such as those associated with $C_{BL03}, C_{BL04}$, and $C_{BL12}$. These currents are smaller in magnitude, but nevertheless appreciable.

According to another aspect of the present invention, a memory device and a method thereof provide sensing a plurality of memory cells in parallel while minimizing errors caused by bit-line to bit-line coupling. Essentially, the bit line voltages of the plurality of bit line coupled to the plurality of memory cells are controlled such that the voltage difference between each adjacent pair of line lines is substantially independent of time while their conduction currents are being sensed. When this condition is imposed, all the currents due to the various bit line capacitance drop out since they all depend on a time varying voltage difference. Thus, from the equation above, since $[i_{BLC00} + i_{BLC01} + i_{BLC02}] = 0$, the current sensed from the bit line is identical to the cell's current, e.g., $i_{BL0} = i_{CELL}$.

Figure 13A:
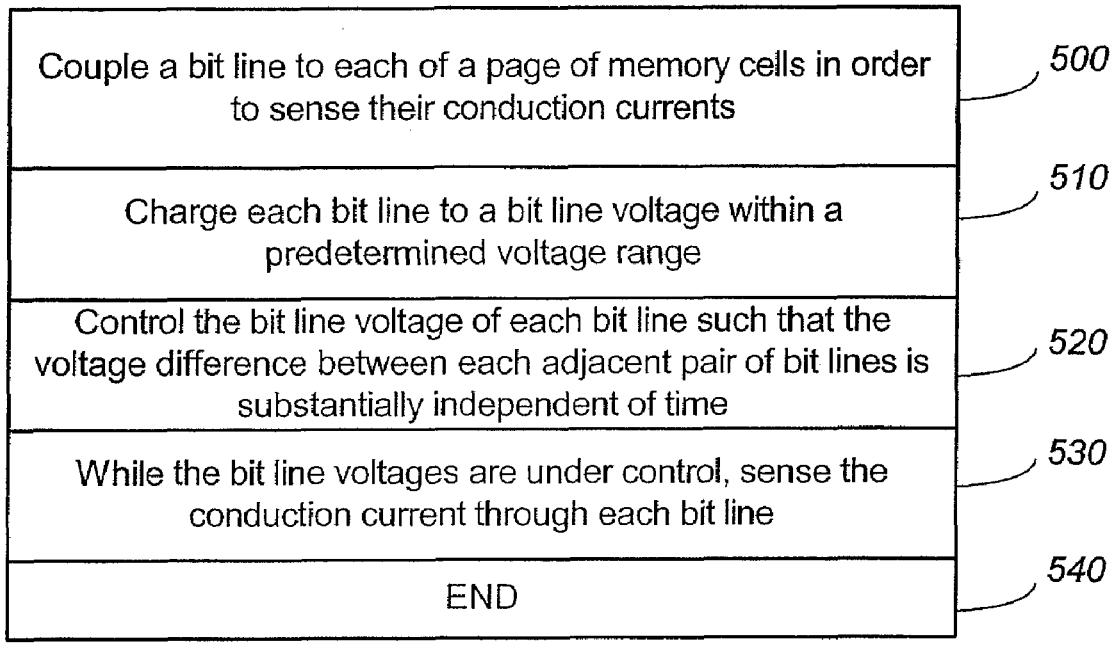
FIG. 13A is a flow diagram showing a method of sensing while reducing bit-line to bit-line coupling.

FIG. 13A is a flow diagram showing a method of sensing while reducing bit-line to bit-line coupling.

STEP 500: Couple a bit line to each of a page of memory cells in order to sense their conduction currents.

STEP 510: Charge each bit line to a bit line voltage within a predetermined voltage range.

STEP 520: Control the bit line voltage of each bit line such that the voltage difference between each adjacent pair of bit lines is substantially independent of time.

STEP 530: While the bit lines are under control, sense the conduction current through each bit line.

STEP 540: End.

According to another aspect of the present invention, in spite of the constant voltage condition, a sensing circuit and method allow determination of the memory cell's conduction current by noting the rate of voltage change of a given capacitor.

Figure 13B:
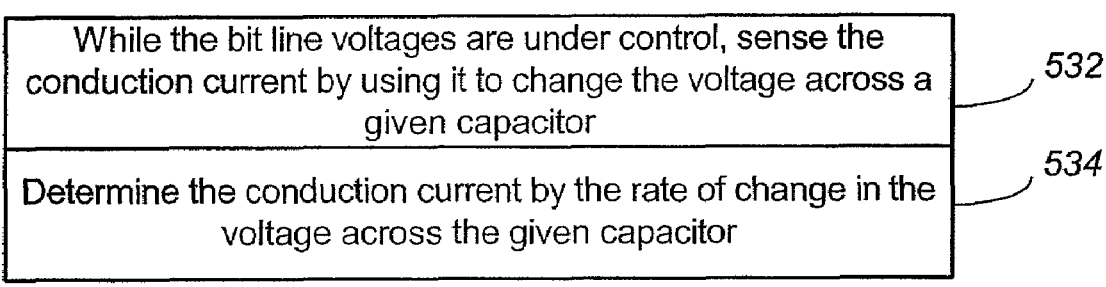
FIG. 13B is a flow diagram showing a more detailed embodiment of the sensing step shown in FIG. 13A.

FIG. 13B is a flow diagram showing a more detailed embodiment of the sensing step 530 shown in FIG. 13A.

STEP 532: While the bit lines are under control, sense the conduction current through each bit line by using it to change the voltage across a given capacitor.

STEP 534: Determine the conduction current by the rate of change in the voltage across the given capacitor.

Figure 14:
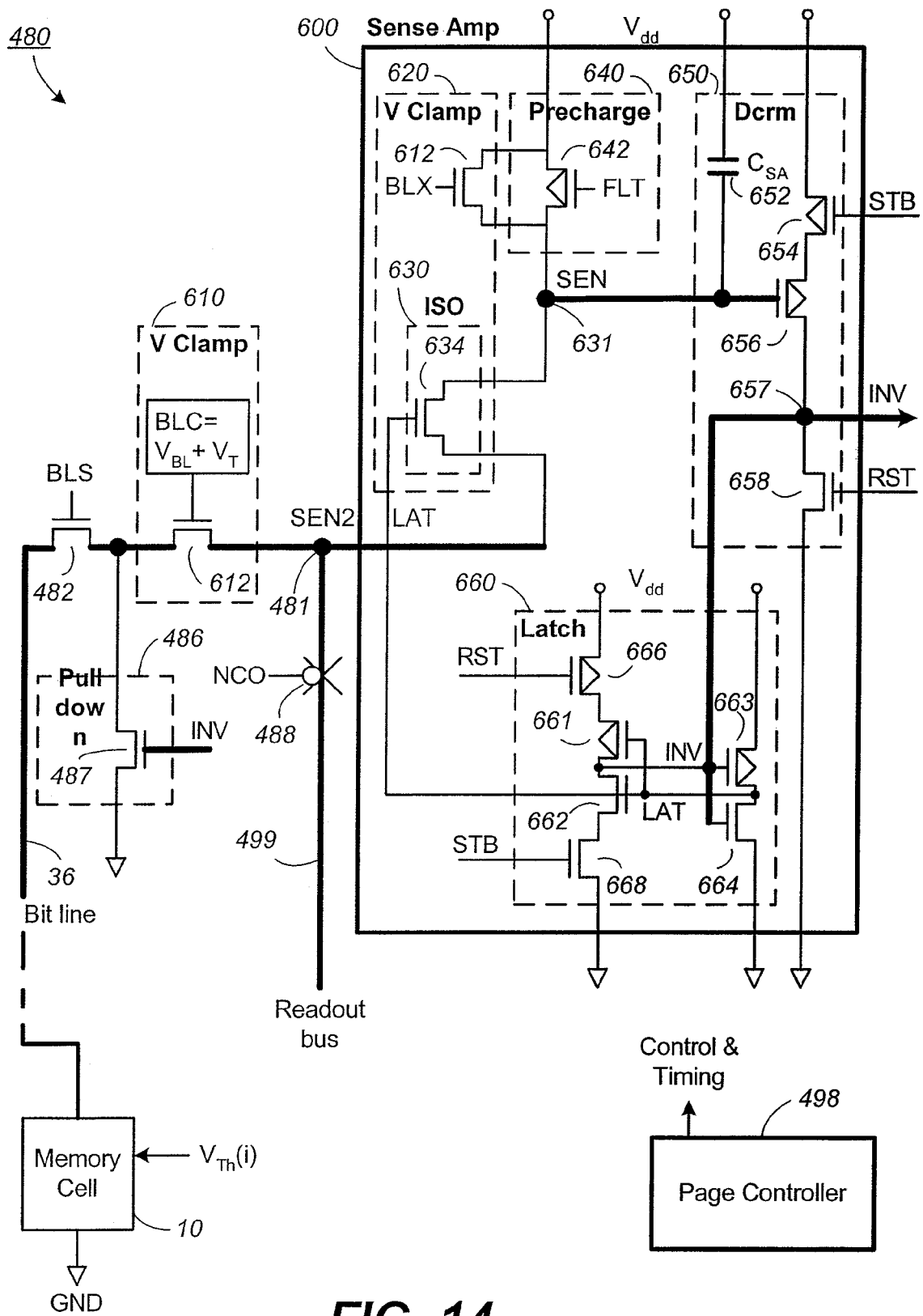
FIG. 14 illustrates a preferred sense module implementing the various aspects of the present invention.

FIG. 14 illustrates a preferred sense module implementing the various aspects of the present invention. The sense module 480 comprises a bit line isolation transistor 482, a bit line pull down circuit 486, a bit line voltage clamp 610, a readout bus transfer gate 488 and a sense amplifier 600.

The sense module 480 is connectable to the bit line 36 of a memory cell 10 when the bit line isolation transistor 482 is enabled by a signal BLS. The sense module 480 senses the conduction current of the memory cell 10 by means of the sense amplifier 600 and latches the read result as a digital voltage level SEN2 at a sense node 481 and outputs it to a readout bus 499.

The sense amplifier 600 essentially comprises a second voltage clamp 620, a precharge circuit 640, a discriminator or compare circuit 650 and a latch 660. The discriminator circuit 650 includes a dedicated capacitor 652.

The sense module 480 is similar to the multi-pass sense module 380 shown in FIG. 10. However, in FIG. 14, the precharge circuit 640 is implemented with a weak pull-up feature as will be described later. This serves as another way of identifying those cells with higher currents in order to turn them off for the purpose of reducing source line bias error.

The sense module 480 also has additional features for reducing bit-line to bit-line coupling. This is implemented by keeping the bit line voltage time-independent during sensing. This is accomplished by the bit line voltage clamp 610. As will be described below, the second voltage clamp 620 ensures the proper functioning of the bit line voltage clamp 610 under all sensing conditions. Also sensing is not done by the prior art method of noting the rate of discharging the capacitance of the bit line due to the conduction current, but the rate of discharging the dedicated capacitor 652 provided by the sense amplifier 600.

One feature of the sense module 480 is the incorporation of a constant voltage supply to the bit line during sensing in order to avoid bit line to bit line coupling. This is preferably implemented by the bit line voltage clamp 610. The bit line voltage clamp 610 operates like a diode clamp with a transistor 612 in series with the bit line 36. Its gate is biased to a constant voltage BLC equal to the desired bit line voltage $V_{BL}$ above its threshold voltage $V_T$. In this way, it isolates the bit line from the sense node 481 and set a constant voltage level for the bit line, such as the desired $V_{BL} = 0.5$ to 0.7 volts. In general the bit line voltage level is set to a level such that it is sufficiently low to avoid a long precharge time, yet sufficiently high to avoid ground noise and other factors.

The sense amplifier 600 senses the conduction current through the sense node 481 and determines whether the conduction current is above or below a predetermined value.

The sense amplifier outputs the sensed result in a digital form as the signal SEN2 at the sense node 481 to the readout bus 499.

The digital control signal INV, which is essentially an inverted state of the signal SEN2, is also output to control the pull down circuit 486. When the sensed conduction current is higher than the predetermined value, INV will be HIGH and SEN2 will be LOW. This result is reinforced by the pull down circuit 486. The pull down circuit 486 includes an n-transistor 487 controlled by the control signal INV.

The operation and timing of the sense module 480 will be described by reference to both FIG. 14 and the timing diagrams FIGS. 15(A)-15(K). FIGS. 15(A)-15(K) are demarcated into PHASES (1)-(9).

Phase (0): Setup

The sense module 480 is connected to the bit line 36 via an enabling signal BLS (FIG. 15(A)(0).) The Voltage clamp is enabled with BLC. (FIG. 15(B)(0).) The Precharge circuit 640 is enabled as a limited current source with a control signal FLT (FIG. 15(C)(0).)

Phase (1): Controlled Precharge

The sense amplifier 600 is initialized by a reset signal RST (FIG. 15(D)(1)) which will pull the signal INV to ground via the transistor 658 Thus on reset, INV is set to LOW. At the same time, a p-transistor 663 pulls a complimentary signal LAT to $V_{dd}$ or HIGH (FIG. 15(F)(1).)

The isolation gate 630 is formed by an n-transistor 634, which is controlled by the signal LAT. Thus after reset, the isolation gate is enabled to connect the sense node 481 to the sense amplifier's internal sense node 631, and the signal SEN2 will be the same as the signal SEN at the internal sense node 631.

The precharge circuit 640 precharges the bit line 36 through the internal sense node 631 and the sense node 481 for a predetermined period of time. This will bring the bit line to an optimum voltage for sensing the conduction therein.

The precharge circuit 640 includes a pull-up p-transistor 642 controlled by the control signal FLT ("FLOAT".) The bit line 36 will be pulled up towards the desired bit line voltage as set by the bit line voltage clamp 610. The rate of pull-up will depend on the conduction current in the bit line 36. The smaller the conduction current, the faster the pull-up.

Figure 15:
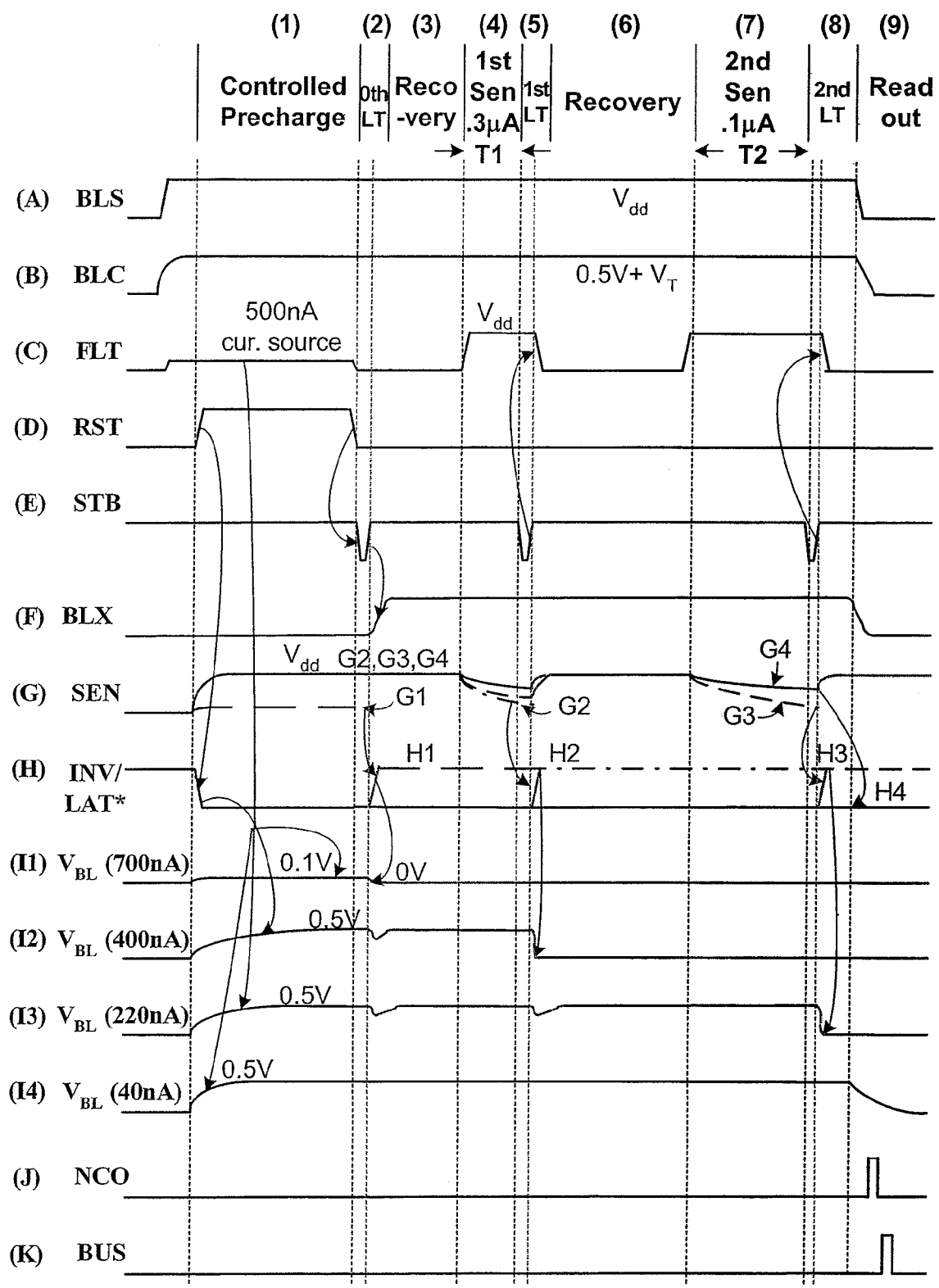
FIG. 15 (A)-FIG. 15(K) are timing diagrams for the sense module shown in FIG. 14.

FIGS. 15(H1)-15(H4) illustrate respectively the bit line voltages of memory cells having conduction currents of 700 nA, 400 nA, 220 nA and 40 nA.

It has been described earlier in connection with FIGS. 7-11 that sensing errors due to the source line bias are minimized if those memory cells with conduction currents higher than a predetermined value are turned off and their contributions to the source line bias eliminated.

According to another aspect of the invention, the precharge circuit 640 is implemented to serve two functions. One is to precharge the bit line to an optimum sensing voltage. The other is to help identify those memory cells with conduction currents higher than a predetermined value for D.C. (Direct Current) sensing so that they may be eliminated from contributing to source line bias.

The D.C. sensing is accomplished by providing a precharge circuit that behaves like a current source for supplying a predetermined current to the bit line. The signal FLT that controls the p-transistor 642 is such that it "programs" a predetermined current to flow through the precharge circuit 640. As an example, the FLT signal may be generated from a current mirror with a reference current set to 500 nA.

When the p-transistor 642 forms the mirrored leg of the current mirror, it will also have the same 500 nA throwing in it.

FIGS. 15(I1)-15(I4) illustrate the voltages on four example bit lines connected respectively to memory cells with conduction currents of 700 nA, 400 nA, 220 nA and 40 nA. When the precharge circuit 640 is a current source with a limit of 500 nA, for example, a memory cell having a conduction current exceeding 500 nA will have the charges on the bit line drained faster than it can accumulate. Consequently, for the bit line with conduction current 700 nA, its voltage or the signal SEN at the internal sense node 631 will remain close to 0 v (FIG. 15(I1)(1).) On the other hand, if the memory cell's conduction current is below 500 nA, the precharge circuit 640 will begin to charge up the bit line and its voltage will begin to rise towards the clamped bit line voltage (e.g., 0.5 v set by the voltage clamp 610). (FIGS. 15(I2)(1)-15(I4)(1).) Correspondingly, the internal sense node 631 will either remain close to 0 v or be pulled up to $V_{dd}$ (FIG. 15(G).) Generally, the smaller the conduction current, the faster the bit line voltage will charge up to the clamped bit line voltage. Thus, by examining the voltage on a bit line after the controlled precharge phase, it is possible to identify if the connected memory cell has a conduction current higher or lower than a predetermined level.

Phase (2): D.C. Latching & Removing the High Current Cells from Subsequent Sensing After the controlled precharge phase, an initial, D.C. high-current sensing phase begins where the signal SEN is sensed by the discriminator circuit 650. The sensing identifies those memory cells with conduction currents higher than the predetermined level. The discriminator circuit 650 includes two p-transistors 654 and 656 in series, which serve as a pull up for a node 657 registering the signal INV. The p-transistor 654 is enabled by a read strobe signal STB going LOW and the p-transistor 656 is enabled by the SEN signal at the internal sense node 631 going LOW. As explained earlier, the high current cells will have the signal SEN close to 0 v or at least unable for its bit lines to be precharged sufficient high to turn off the p-transistor 656. For example, if the weak pull up is limited to a current of 500 nA, it will fail to pull up a cell with conduction current of 700 nA (FIG. 15 (G1)(2).) When STB strobes LOW to latch, INV at the node 657 is pulled up to $V_{dd}$. This will set the latch circuit 660 with INV HIGH and LAT LOW (FIG. 15 (H1)(2).)

When INV is HIGH and LAT LOW, the isolation gate 630 is disabled and the sense node 481 is blocked from the internal sense node 631. At the same time, the bit line 36 is pulled to ground by the pull down circuit 486 (FIG. 15(I1) (2).) This will effective turn off any conduction current in the bit line, eliminating it from contributing to source line bias.

Thus, in one preferred implementation of the sense module 480, a limited-current source precharge circuit is employed. This provides an additional or alternative way (D.C. sensing) to identify bit lines carrying high currents and to turn them off to minimize source line bias error in subsequent sensing.

In another embodiment, the precharge circuit is not specifically configured to help identify high current bit lines but is optimized to pull up and precharge the bit line as fast as possible within the allowance of the maximum current available to the memory system.

Phase (3): Recovery/Precharge

Prior to a sensing of the conduction current in a bit line such as bit line 36 that has not been previously pulled down, the precharge circuit is activated by the signal FLT to precharge the internal sense node 631 to $V_{dd}$ (FIG. 15(C)(3) and FIGS. 15(I2)(3)-15(I4)(3).)

Phase (4): 1st A.C. Sensing

The operation from here onwards is similar to the multi-pass sensing described in connection with FIGS. 10-11 in that the sense node is floated and its voltage changes during current sensing (A.C. or Alternate Current sensing.) The enhancement in FIG. 14 is that the sensing is performed with the bit line voltage kept constant to avoid bit-line to bit-line coupling.

In a preferred embodiment, an A.C. (Alternate Current) sensing is performed by determining the voltage drop at the floated internal sense node 631. This is accomplished by the discriminator or compare circuit 650 employing the capacitor $C_{SA}$ 652 coupled to the internal sense node 631, and considering the rate the conduction current is discharging it. In an integrated circuit environment, the capacitor 652 is typically implemented with a transistor. It has a predetermined capacitance, e.g., 30 fF, which can be selected for optimum current determination. The demarcation current value, typically in the range 100-1000 nA, can be set by appropriate adjustment of the discharging period.

The discriminator circuit 650 senses the signal SEN in the internal sense node 631. Prior to each sensing, the signal SEN at the internal sense node 631 is pull up to $V_{dd}$ by the precharge circuit 640. This will initially set the voltage across the capacitor 652 to be zero.

When the sense amplifier 600 is ready to sense, the precharge circuit 640 is disabled by FLT going HIGH (FIG. 15(C)(4).) The first sensing period T1 is set by the assertion of the strobe signal STB. During the sensing period, a conduction current induced by a conducting memory cell will discharge the capacitor. SEN will decrease from $V_{dd}$ as the capacitor 652 is discharging through the draining action of the conduction current in the bit line 36. FIGS. 15(G2)-15(G4) illustrate respectively the SEN signal corresponding to the remaining three example bit lines connected respectively to memory cells with conduction currents of 400 nA, 220 nA and 40 nA. The decrease being more rapid for those with a higher conduction current.

Phase (5): 1st A.C. Latching and Removal of Higher Current Cells from Subsequent Sensing At the end of the first predetermined sensing period, SEN will have decreased to some voltage depending on the conduction current in the bit line 36 (FIGS. 15(G2)(4)-15(G4)(4).) As an example, the demarcation current in this first phase is set to be at 300 nA. The capacitor $C_{SA}$ 652, the sensing period T1 and the threshold voltage of the p-transistor 656 are such that the signal SEN corresponding to a conduction current higher that the demarcation current (e.g., 300 nA) will drop sufficient low to turn on the transistor 656 in the discriminator circuit 650. When latching signal STB strobes LOW, the output signal INV will be pulled HIGH, and will be latched by the latch 660 (FIG. 15(E)(5) and FIG. 15(H2).) On the other hand, the signal SEN corresponding to a conduction current below the demarcation current will produce a signal SEN unable to turn on the transistor 656. In this case, the latch 660 will remain unchanged, in which case LAT remains HIGH (FIGS. 15(H3) and 15(H4).) Thus it can be seen that the discriminator circuit 650 effectively determines the magnitude of the conduction current in the bit line 36 relative to a reference current set by the sensing period.

The sense amplifier 600 also includes the second voltage clamp 620 whose purpose is to maintain the voltage of the drain of the transistor 612 sufficiently high in order for the bit line voltage clamp 610 to function properly. As described earlier, the bit line voltage clamp 610 clamps the bit line voltage to a predetermined value $V_{BL}$, e.g., 0.5 v. This will require the gate voltage BLC of the transistor 612 to be set at $V_{BL}+V_T$ (where $V_T$ is the threshold voltage of the transistor 612) and the drain connected to the sense node 481 to be greater than the source, i.e., the signal SEN2>$V_{BL}$. In particular, given the configurations of the voltage clamps 610 and 620, SEN2 should be no higher than the smaller of (LAT-$V_T$) or (BLX-$V_T$), and SEN should be no lower. During sensing, the isolation gate 630 is in a pass-through mode. However, during sensing the signal SEN at the internal sense node 631 has a voltage that decreases from $V_{dd}$. The second voltage clamp 620 prevents SEN from dropping to (LAT-$V_T$) or (BLX-$V_T$), whichever is lower. This is accomplished by an n-transistor 612 controlled by a signal BLX, where BLX is $\geq V_{BL}+2V_T$ (FIG. 15(F).) Thus, through the actions of the voltage clamps 610 and 620, the bit line voltage $V_{BL}$ is kept constant, e.g. ~0.5 v during sensing.

Measuring current using a dedicated capacitor 652 instead of prior art's use of the bit line capacitance is advantageous in several respects. First, it allows a constant voltage source on the bit line thereby avoiding bit-line to bit-line crosstalk. Secondly, the dedicated capacitor 652 allows a capacitance to be selected that is optimal for sensing. For example, it may have a capacitance of about 30 fF as compared to a bit line capacitance of about 2 pF. A smaller capacitance can increase the sensing speed since it discharges faster. Finally, sensing relative to a dedicated capacitance as compared to the prior art method of using the capacitance of the bit line allows the sensing circuits to be independent of the memory architecture.

In another embodiment, the current determination is accomplished by comparison with a reference current, which may be provided by the conduction current of a reference memory cell. This could be implemented with the compare current as part of a current mirror.

The output of the current determination LAT is latched by the latch circuit 660. The latch circuit is formed as a Set/Reset latch by the transistors 661, 662, 663, and 664 together with the transistors 666 and 668. The p-transistor 666 is controlled by the signal RST (RESET) and the n-transistor 668 is controlled by the signal STB (STROBE or SET*.)

In general, there will be a page of memory cells being operated on by a corresponding number of multi-pass sense modules 480. For those memory cells having conduction current higher than the first demarcation current level, their LAT signal will be latch LOW. This in turns activates the bit line pull down circuit 486 to pull the corresponding bit lines to ground, thereby turn off their currents.

Phase (6): Recovery/Precharge

Prior to the next sensing of the conduction current in a bit line such as bit line 36 that has not been previously pulled down, the precharge circuit is activated by the signal FLT to precharge the internal sense node 631 to $V_{dd}$ (FIG. 15(C)(6) and FIGS. 15(I3)(6)-15(I4)(6).)

Phase (7): 2nd Sensing

When the sense amplifier 600 is ready to sense, the precharge circuit 642 is disabled by FLT going HIGH (FIG. 15(C)(7).) The second sensing period T2 is set by the assertion of the strobe signal STB. During the sensing period, a conduction current, if any will discharge the capacitor. SEN will decrease from $V_{dd}$ as the capacitor 652 is discharging through the draining action of the conduction current in the bit line 36.

In accordance with the example before, the memory cells with conduction currents higher than 300 nA have already been identified and shut down in the earlier phases. FIGS. 15(G3)(7) and 15(G4)(7) illustrate respectively the SEN signal corresponding to the two example bit lines connected respectively to memory cells with conduction currents of 220 nA and 40 nA.

Phase (8): $2^{nd}$ Latching for Reading Out

At the end of the second predetermined sensing period T2, SEN will have decreased to some voltage depending, on the conduction current in the bit line 36 (FIGS. 15(G3)(7)-15(G4)(7).) As an example, the demarcation current in this second phase is set to be at 100 NA. In this case, the memory cell with the conduction current 220 nA will have its LAT latched LOW (FIG. 15(H3)(7)) and its bit line subsequently pulled to ground (FIG. 15(I3)(7).) On the other hand, the memory cell with the conduction current 40 nA will have no effect on the state of the latch, which was preset with LAT HIGH.

Phase (9): Read Out to the Bus

Finally, in the read out phase, the control signal NCO at the transfer gate 488 allows the latched signal SEN2 to be read out to the readout bus 499 (FIGS. 15(J) and 15(K).)

A page controller such as the page controller 398 also shown in FIG. 10 supplies control and timing signals to each of the sense modules.

As can be seen from FIGS. 15(I1)-15(I4), the bit line voltage remains constant during each sensing period. Thus, from the discussion early, capacitive bit-line to bit-line coupling is eliminated.

The sense mode 480 shown in FIG. 14 is one preferred embodiment where sensing is performed with three passes. The first two passes being implemented to identify and shut down higher current memory cells. With the higher current contributions to the source line bias eliminated, the final pass is able to sense the cells with lower range conduction currents more accurately.

In other embodiments, sensing operations are implemented with different combination of D.C. and A.C. passes. Some even use only two or more A.C. passes. For the different passes, the demarcation current value used may be the same each time or converge progressively towards the demarcation current used in the final pass.

Management Of The Errors Introduced by Neighboring Floating Gate Coupling

Another error inherent in high density integrated circuit, non-volatile memory device is due to neighboring floating gate coupling, as described earlier. The close proximity of the memory cells causes field perturbations from the charge elements of neighboring cells. According to another aspect of the present invention, the errors due to the perturbations are minimized by minimizing the change in the field environment of each cell between programming and reading. This is accomplished by programming all adjacent memory cells in a page thereof together. Since the individual memory cells and their neighbors are programmed together, it will ensure a minimum change in field environment seen by the individual cells from the time they are programmed to the time they are read.

This is in contrast to the prior art case of programming even and odd pages independently. In that case, after the memory cells of an even page have been programmed, the field contributed by their adjacent memory cells in an odd page may have changed radically when the odd page is programmed with a different set of data.

As described earlier, the number of memory cells in a "page" that are programmed or read simultaneously may vary according to the size of data sent or requested by a host system. Thus, there are several ways to program the memory cells coupled to a single word line, such as (1) programming even bit lines and odd bit lines separately, which may comprise upper page programming and lower page programming, (2) programming all the bit lines ("all-bit-line programming"), or (3) programming all the bit lines in a left or right page separately, which may comprise right page programming and a left page.

In existing non-volatile memory devices, a row of memory cells joined by the same word lines is configured into two interleaving pages. One page consists of memory cells of the even columns and the other page consists of memory cells of the odd columns. The even or odd pages are separately sensed and programmed. As mentioned earlier, this is necessitated by the need to control bit-line to bit-line coupling. Thus, it is preferable to ground alternate bit lines while read/write operations are performed on the other set of the bit lines.

However, as mentioned earlier, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in reducing other disturb effects such as field coupling from neighboring charge storage elements.

All Bit Line Programming

As described in connection with FIGS. 12-15, it is possible by the present invention to control bit-line to bit-line coupling. Thus, there is no need to ground alternate bit lines during sensing or program verify, thereby relaxing the requirement to operate on even or odd pages with non-contiguous memory cells and speeding up verify operations.

According to another aspect of the invention, a contiguous page of memory cells are programming in parallel while bit-line to bit-line coupling is under control. This will minimize the extraneous field effects from neighboring floating gates.

The sense module shown in FIG. 6A, FIG. 10 and FIG. 14 is preferably implemented in a memory architecture configured to perform all-bit-line sensing. In other words, contiguous memory cells in a row are each connectable to a sense module to perform sensing in parallel. Such a memory architecture is also disclosed in co-pending and commonly assigned U.S. patent application Ser. No. 10/254,483 filed Sep. 24, 2002, entitled "Highly Compact Non-Volatile Memory And Method Thereof," by Raul-Adrian Cernea. The entire disclosure of said patent application is hereby incorporated herein by reference.

Figure 16A:
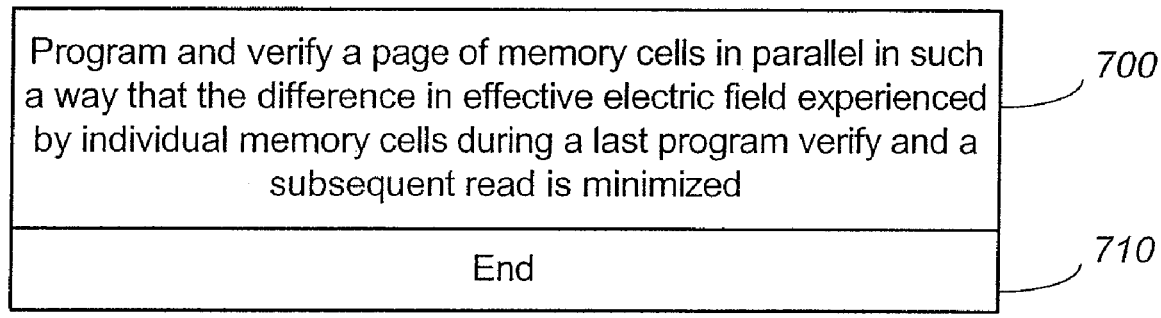
FIG. 16A is a flow diagram showing a method of programming and reading that reduces the errors due to neighboring floating gate coupling.

FIG. 16A is a flow diagram showing a method of programming and reading that reduces the errors due to neighboring floating gate coupling.

STEP 700: Program and verify a page of memory cells in parallel in such a way that the difference in effective electric field experienced by individual memory cells during a last program verify and a subsequent read is minimized.

STEP 710: End.

Figure 16B:
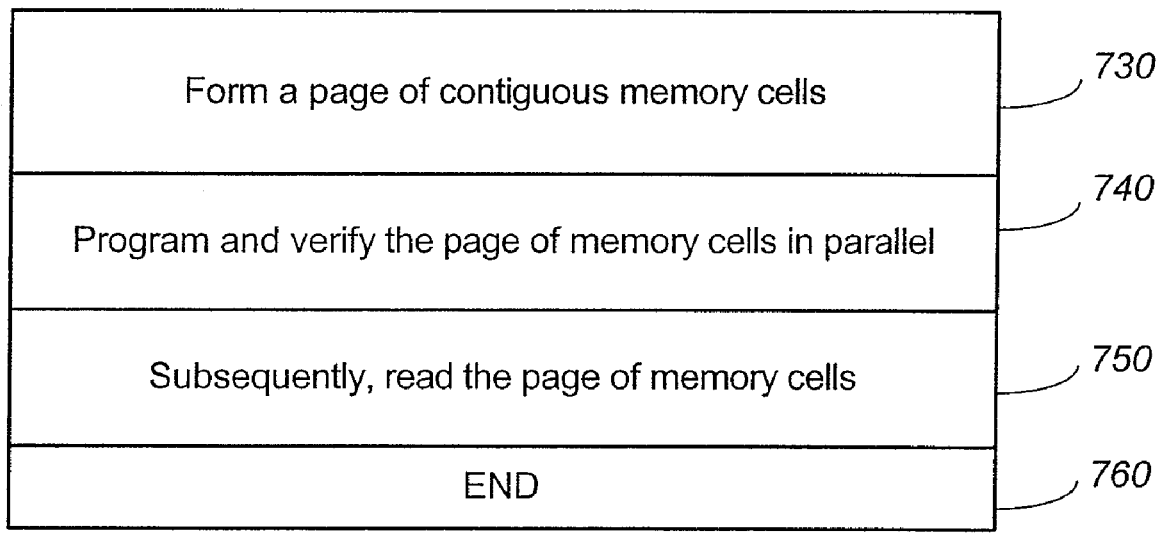
FIG. 16B is a flow diagram showing a preferred embodiment of the inventive step shown in FIG. 16A.

FIG. 16B is a flow diagram showing a preferred embodiment of the inventive step shown in FIG. 16A.

STEP 730: Form a page of contiguous memory cells.

STEP 740: Program and verify the page of memory cells in parallel.

STEP 750: Subsequently, read the page of memory cells

STEP 760: End.

Programming Left and Right Pages

Figure 17:
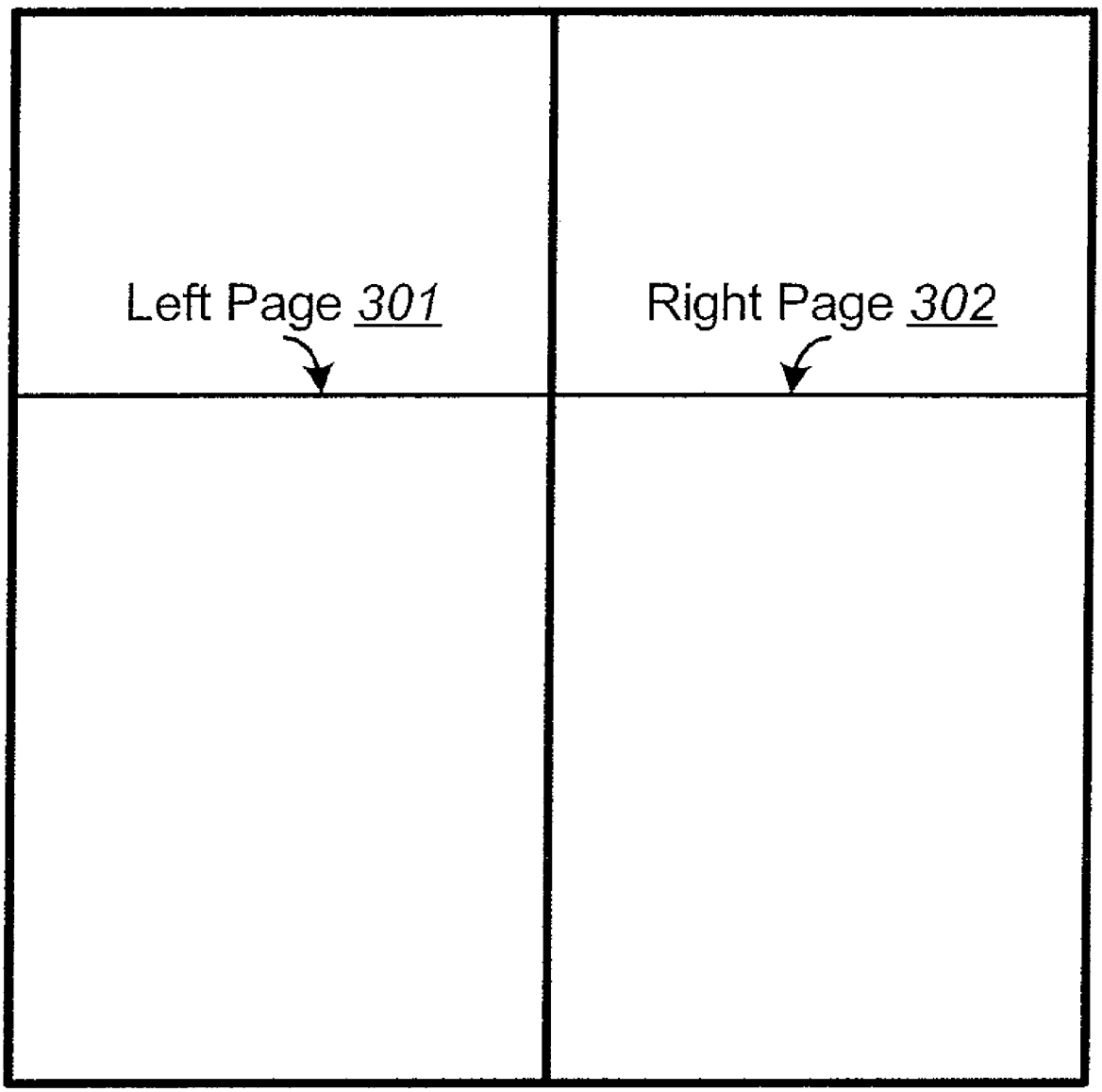
FIG. 17 illustrates a memory array similar to that shown in FIGS. 6A and 6B, except its architecture has each row of memory cells organized into a left page and a right page of memory cells.

FIG. 17 illustrates a memory array similar to that shown in FIGS. 6A and 6B, except its architecture has each row of memory cells organized into a left pages 301 and a right page 302 of memory cells. Each page consists of a plurality of contiguous memory cells. For example, each page may have 4,256 cells. In the preferred embodiment, programming is performed on the left page and the right page individually. To minimize interaction between the two independent pages, while one page is being programmed, the other page has all its bit lines grounded. Again, by having each page contiguous, neighboring floating gate coupling is reduced during programming.

Controlled Latching Of Selected Bitlines to Ground

The multi-pass sensing has been described earlier with respect to FIGS. 7-11 and FIG. 15. In particular, when a page of memory cells are sensed in parallel, those detected with a current state higher than a predetermined threshold have their bit line latched to ground so that their contributions to the source line bias error are eliminated in a subsequent pass of sensing the page of memory cells.

According to yet another preferred embodiment, a memory cell that has been detected with a higher current than a predetermined demarcation level does not necessarily have its bit line grounded immediately after detection. Instead, it is marked or enabled for grounding. Only, after the detection or sensing has been completed for all the memory cells of the page will all the marked or enabled bit lines be latched to ground. In this way, possible large voltage swings associated with the bit lines being latched to ground are confined to a period outside the sensing operation. This will minimize any disturbance effects of a bit line latching to ground on any memory cells of the page that is still undergoing sensing and detection.

Figure 18:
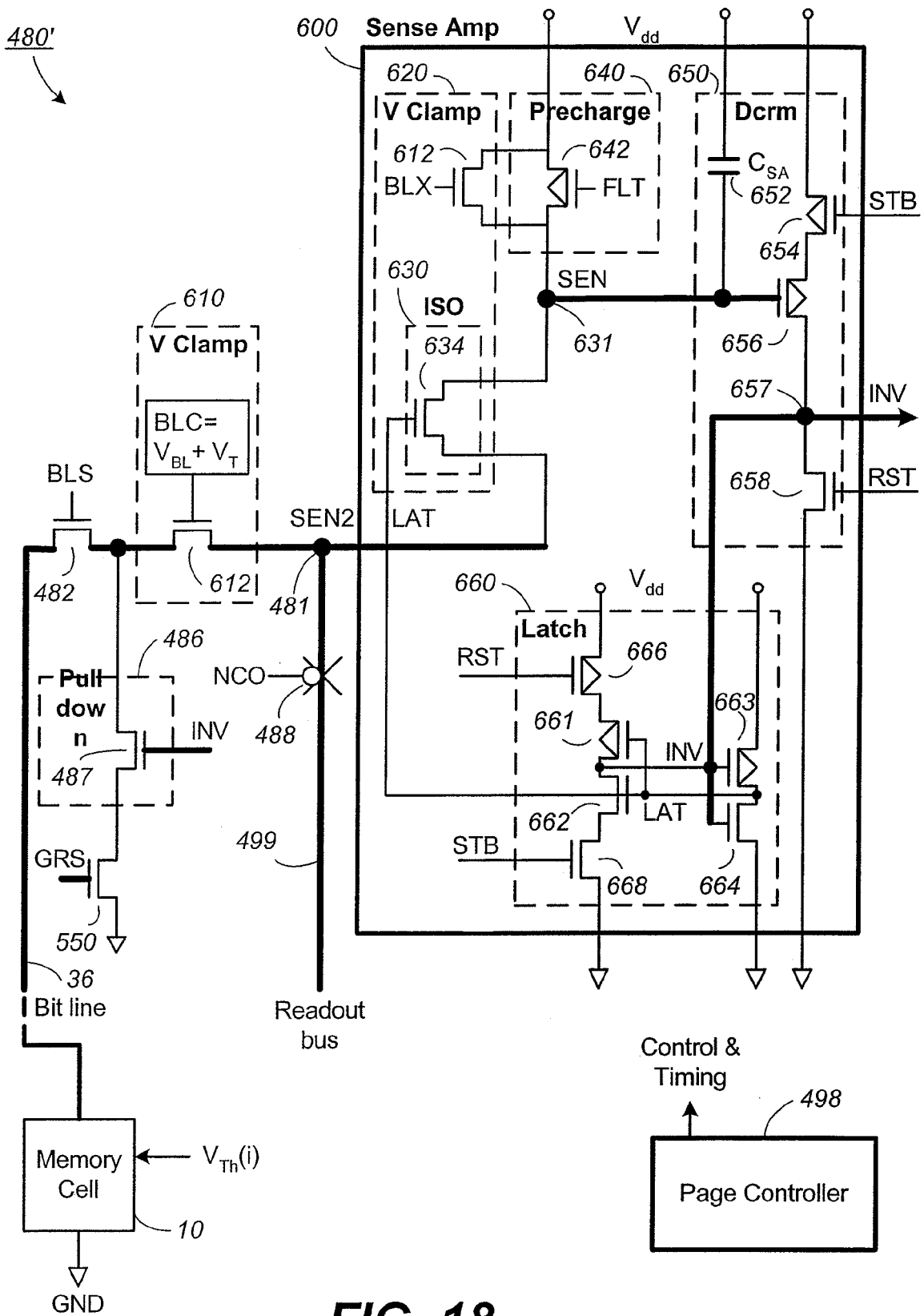
FIG. 18 illustrates another preferred embodiment of a sense module.

FIG. 18 illustrates another preferred embodiment of a sense module. The sense module 480' is similar to the sense module 480 shown in FIG. 14, with the addition of another grounding control switch 550 in series with the pull down circuit 486 to ground. This arrangement effectively allows the bit line 36 to be pull down to ground only when both the pull down circuit 486 and the grounding control switch 550 are enabled. The grounding control switch 550 is illustrated as an n-transistor controlled by a signal GRS at its gate. When the memory cell 10 is detected to have conduction current higher than a predetermined threshold, the sense amplifier will generate a latched HIGH INV signal. This will enable the pull down circuit 486. After all cells of the page have completed the sensing operation for the current pass, the page controller 498 will assert a HIGH GRS signal. In this way, all bit lines of the page that have its pull down circuits enabled will be pulled down to ground at that instant.

FIG. 19(A)-FIG. 19(K) are timing diagrams for the sense module shown in FIG. 18. In particular, FIG. 19(H1) illustrate the timing signal GRS. It can be seen that the sensing and latching take place at periods (2) (5) and (8) and the signal GRS is asserted well after and outside each of these period so that the grounding of the appropriate bit lines will not disturb the sensing and latching operations.

Figure 20:
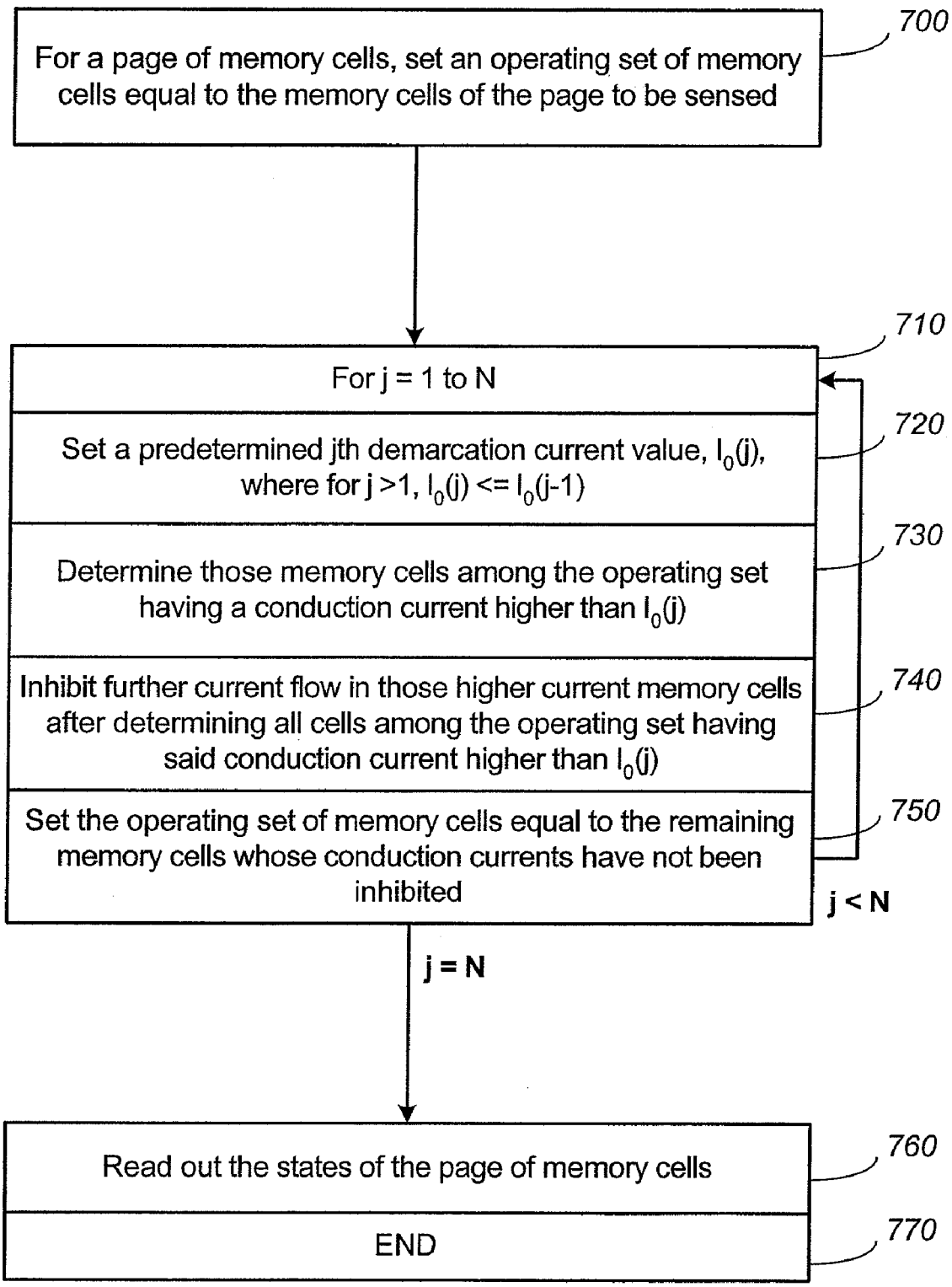
FIG. 20 is a flow diagram showing the operation of the sense module of FIG. 18.

FIG. 20 is a flow diagram showing the operation of the sense module of FIG. 18.

STEP 700: For a page of memory cells, initially set an operating set of memory cells equal to the page of memory cells.

STEP 710: Begin the multi-pass j=1 to N.

STEP 720: Set a demarcation current value, $I_0(j)$, where after the first pass j>1, $I_0(j)$ is less than or equal that of a previous pass j-1, i.e. $I_0(j)<=I_0(j-1)$.

STEP 730: Determine those memory cells among the operating set having a conduction current higher than the demarcation current value $I_0(j)$.

STEP 740: After the operating set no longer have a conduction current higher than the demarcation current value $I_0(j)$, Inhibit further current flow in those memory cells with a conduction current higher than the demarcation current value $I_0(j)$.

STEP 750: Set the operating set of memory cells equal to the remaining memory cells whose conduction currents have not been inhibited. If j<N, return to STEP 710, otherwise proceed to STEP 760.

STEP 760: Read out the states of the page of memory cells.

STEP 770: End.

Reference Sense Amplifier for Providing Reference Controlled Signals for Multiple Sense Amplifiers In order to improve performance, read/write operations are performed on a page of memory storage units in parallel. For example, a page may consist of 4096 memory storage units and therefore an equal number of sense amplifiers would be required to operate in parallel.

Since each sense amplifier is required to sense the conduction current of a memory storage unit accurately, it is preferably that its sensing characteristics is not affected by variations in power supply, operating temperature and manufacturing process.

According to yet another aspect of the invention, a reference sense amplifier having characteristics representative of a population of sense amplifiers is used to track environment and systemic variations and control the population of sense amplifiers so that they are independent of these variations.

Figure 21A:
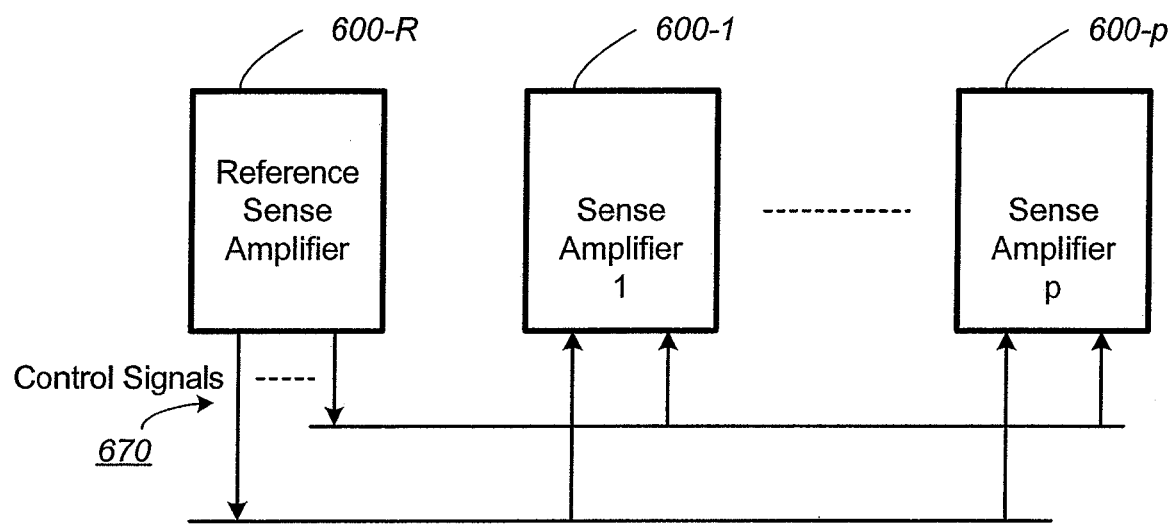
FIG. 21A illustrates schematically a reference sense amplifier providing reference control signals for a population of sense amplifiers.
Figure 21B:
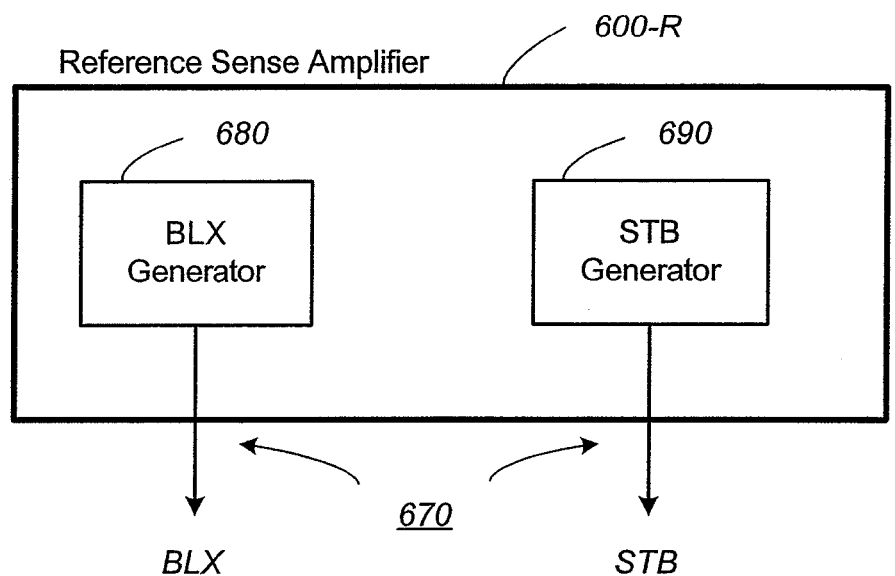
FIG. 21B illustrates a reference sense amplifier providing two example reference control signals, such as BLX and STB.

FIG. 21A illustrates schematically a reference sense amplifier providing reference control signals for a population of sense amplifiers. A population of sense amplifiers 600-1, ... 600-p is operated in parallel. A reference sense amplifier 600-R is implemented to generate and provide control signals 670 which may be a portion of the control signals for controlling the population of sense amplifiers. The reference sense amplifier 600-R while not necessary identical to a typical member of the sense amplifier population, nevertheless possesses characteristics representative a typical member of the population FIG. 21B illustrates a reference sense amplifier providing two example reference control signals, such as BLX and STB. In one embodiment, the reference sense amplifier 600-R comprises a BLX signal generator 680 that outputs the BLX signal. Similarly, the reference sense amplifier 600-R comprises a STB generator 690 that outputs the STB signal. These signals have been described in connection with the sense amplifier 600 shown in FIG. 18. In particular, the BLX signal is used to help the bit line clamped at a given voltage. Similarly, the STB signal is used to time sensing and is provided by a STB signal generator. It will be seen that these signals are dependent on the supply voltage $V_{dd}$ and the threshold voltages $V_{TN}$ or $V_{TP}$ of the n-transistor or p-transistor respectively in the sense amplifiers. These parameters are in turn sensitive to manufacturing process and operating temperature. These systemic variations are minimized by having all sense amplifiers employing the same calibrated control signals provided by the reference sense amplifier 600-R.

The operating requirement of a typical sense amplifier such as that show in FIG. 18 is first described with emphasis on its dependency on $V_{dd}$ and the various threshold voltages of its transistors. FIG. 18 shows one preferred sense amplifier 600. As described earlier, the sense amplifier 600 essentially measures the conduction current of a memory storage unit 10 by the rate it charges or discharges a given capacitor 652. This is accomplished by sensing the signal SEN at the node 631. The signal SEN controls the gate of the p-transistor 656. Prior to sensing, SEN is precharged to $V_{dd}$ (HIGH) by the precharge circuit 640. This will initially set the voltage across the capacitor 652 to be zero. During sensing, the conduction current of the memory storage unit 10 will discharge the capacitor. SEN will then decrease from $V_{dd}$ at a rate depending on the conduction current. After a predetermined sensing period, the period being corresponding to a reference current, SEN will drop to some value that may or may not turn on the measuring p-transistor 656. If it drops sufficiently low to turn on the p-transistor 656, it will mean that the conduction current is higher than the reference current. On the other hand, if the transistor 656 is not turned on at the end of the sensing period, the conduction current is lower than the reference current.

Thus, it can be seen that the discrimination level of the measuring p-transistor 656 is critically depending on the value of its threshold voltage $V_{TP}$. As can be seen from FIG. 18, that the critical voltage for the measuring p-transistor 656 to turn on is when SEN$\sim<V_{dd}-V_{TP}$ (where $V_{TP}$ is the threshold voltage of the p-transistor 656.)

With regard to the operating requirement of the BLX signal, attention is turned to the pull up circuit in the form of a voltage clamp 620 in the sense amplifier 600. During the initial precharge period, the active pull up is performed by the precharge circuit 640. In subsequent periods (see FIG. 19) the precharge circuit 640 is turned off to allow sensing. Through the sensing period, the voltage clamp 620 is then enabled to keep the voltage on the node 481 (i.e. SEN2) above a given minimum so that the bit line voltage clamp 610 can function properly. However, this pull up must not be too high that results in a SEN signal clamped so high that it can never fall sufficiently low to turn on the measuring p-transistor 656. This can be controlled by setting the signal strength of BLX as applied to the gate of the n-transistor 612 of the voltage clamp 620.

It can be seen from FIG. 18 that the condition for the critical voltage for the measuring p-transistor 656 to turn on is when SEN$\sim<V_{dd}-V_{TP}$ at node 631. The voltage clamp 620 must therefore clamp the node 631 so that it is less than $V_{dd}-V_{TP}$. This is accomplished by setting the voltage clamp such that BLX$\sim<V_{dd}-V_{TP}+V_{TN}$ (where $V_{TN}$ is the threshold voltage of the n-transistor 612.)

Figure 22:
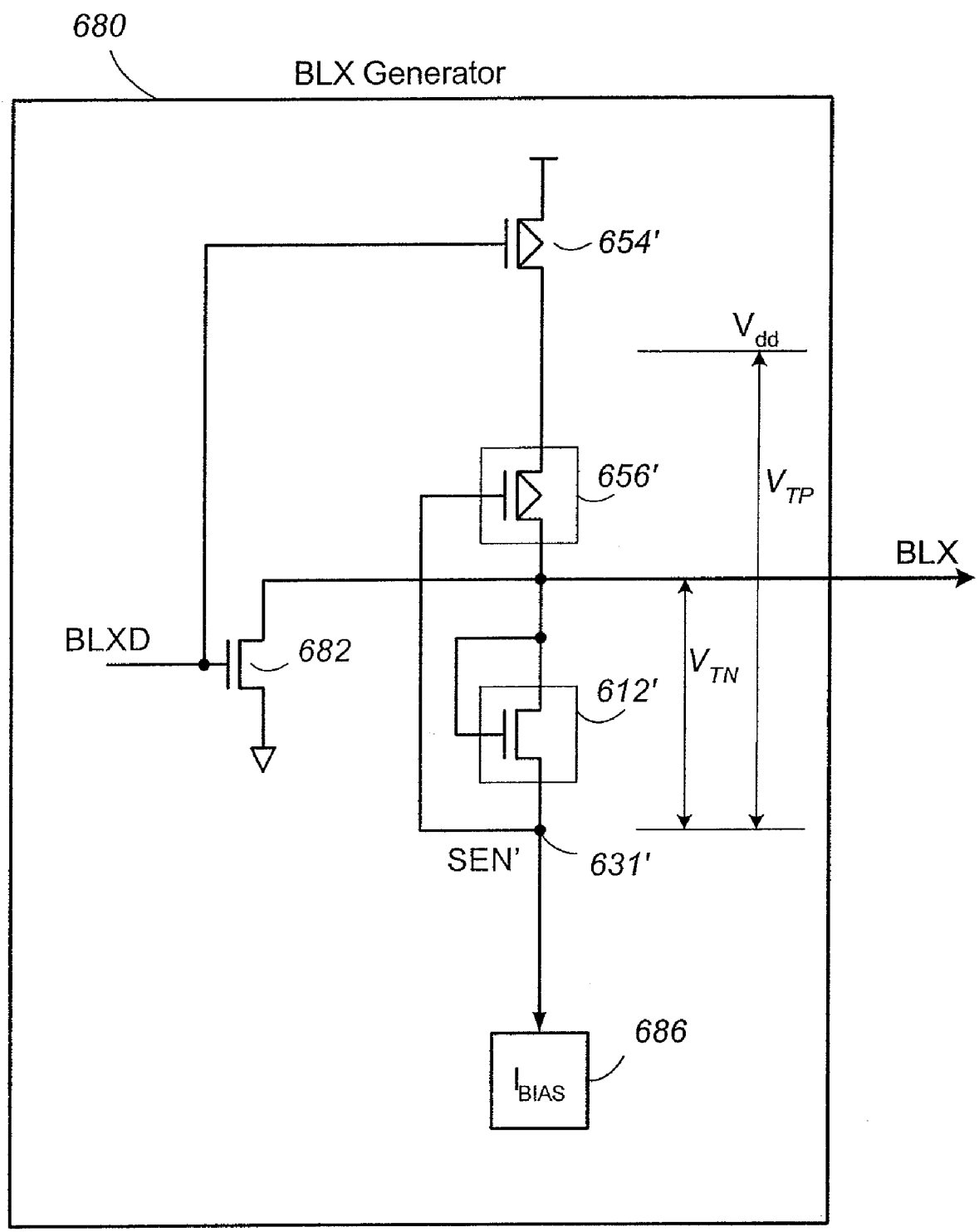
FIG. 22 illustrates a preferred embodiment of the BLX generator.

FIG. 22 illustrates a preferred embodiment of the BLX generator. The BLX generator 680 essentially provides a BLX signal that satisfies the condition that BLX must be below $V_{dd}-V_{TP}+V_{TN}$. An important consideration is to employ reference circuit elements that have the same characteristics as and are representative of the population of the sense amplifiers it is seeking to control. In particular, these reference circuit elements will provide references to various systemic parameters such as the supply voltage $V_{dd}$, threshold voltages of the component transistors, $V_{TP}$ and $V_{TN}$, etc, which are common with the population of sense amplifiers.

In FIG. 22, for expediency, a circuit element corresponding to those in the sense amplifier shown in FIG. 18 is designated by the same numeral with a prime. Thus, the n-transistor 612' in the reference sense amplifier 600-R corresponds to the n-transistor 612 in the voltage clamp 620 of the sense amplifier 600. The p-transistor 656' corresponds to the measuring p-transistor 656 and the p-transistor 654' corresponds to the p-transistor 654 in the sense amplifier 600. Similarly, the sense node 631' carrying the signal SEN' in the BLX generator 680 would correspond to the sense node 631 in the sense amplifier 600 shown in FIG. 18.

Two logic gates 682 and 654' help to turn on or off the signal BLX. When the control signal BLXD is HIGH, it turns on the logic gate 682 and pulls the BLX signal to ground. At the same time, it turns off the p-logic gate 654' which in turn cuts off the $V_{dd}$ supply. When the control signal BLXD is LOW, the circuit 680 is enabled.

The conditions for the BLX generator 680 to satisfy are: SEN'$\sim<V_{dd}-V_{TP}$ at node 631' and BLX$\sim$SEN'$+V_{TN}$. The n-transistor 612' and the p-transistor 656' are both configured as diodes, so that their diode drop respectively provide the required voltages $V_{TN}$ and $V_{TP}$. In a preferred embodiment, the diode formed by the n-transistor 612' has its source connected to the reference node 631' where the signal SEN' resides and its drain connected to the output BLX. In this way the condition BLX$\sim$SEN'$+V_{TN}$ is satisfied. Similarly, the diode formed by the p-transistor 656' has its drain coupled to the reference node 631' and its source to $V_{dd}$. In this way the condition SEN'$\sim<V_{dd}-V_{TP}$ is also satisfied as desired.

These conditions are predicated on a threshold current flowing through the source and drain of these two diodes. A bias current is provided by a current source 686. The bias current is set to a value higher than that normally flows in the typical sense amplifier. The higher value is to satisfy the inequality in the SEN'$\sim<V_{dd}-V_{TP}$ requirement. The higher the value, the more margin there is to allow for variations of the threshold voltages of the transistors among the population of sense amplifiers. Thus, a control signal BLX is generated by the reference sense amplifier 600-R with respect to threshold voltages $V_{TN}$ or $V_{TP}$ calibrated against the supply voltage $V_{dd}$ and other environment conditions.

The reference sense amplifier is preferably located on the same chip and close to the population of sense amplifiers it is providing a reference to. In this way, any variations in manufacturing process or operating temperature will be minimized by their common-mode operations.

Figure 23:
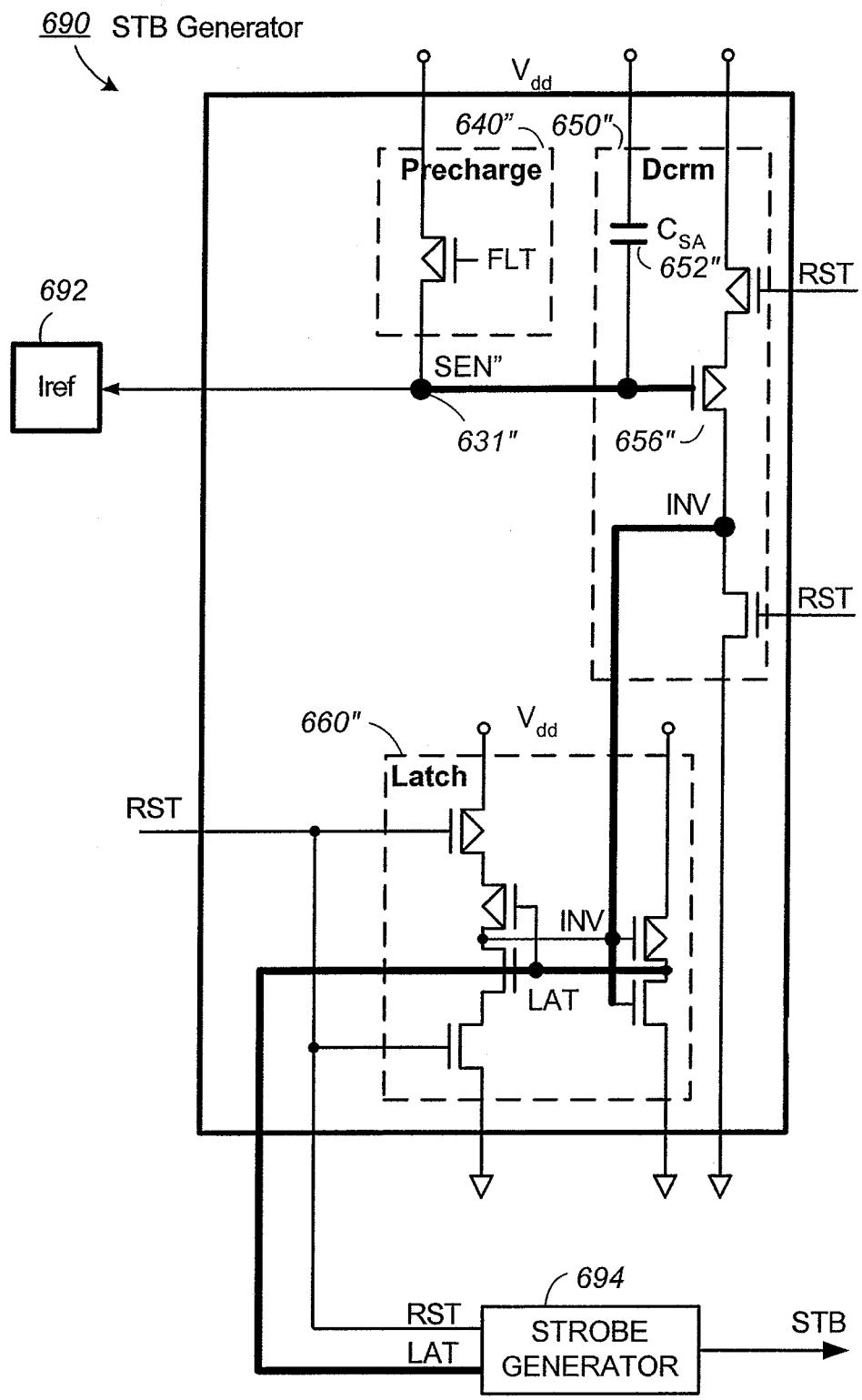
FIG. 23 illustrates schematically a preferred STB generator for generating a strobe signal for controlling the sensing time of the population of sense amplifiers.

FIG. 23 illustrates schematically a preferred STB generator for generating a strobe signal for controlling the sensing time of the sense amplifiers among the population. In a preferred embodiment, the components of the STB generator 690 are similar to that of a typical sense amplifier 600 (see FIG. 18.) It comprises a precharge circuit 640", a discriminator circuit 650" and a latch 660". In place of the memory storage unit 10 supplying the conduction current, a reference current source 692 sinks a reference current from the sense node 631". The reference current corresponds to the breakpoint current the sense amplifier is comparing against during sensing.

Referring for a moment to the sense amplifier 600 shown in FIG. 18, during sensing the given capacitor 652 is discharged by the conduction current flowing through the sense node 631. The conduction current is supplied by the memory storage unit 10. The signal SEN in the sense node 631 will then decrease from $V_{dd}$ at a rate depending on the conduction current. After some time, SEN will eventually drop to $V_{dd}-V_{TP}$ and at which point it will trigger a turn-on of the measuring p-transistor 656. Thus, this triggering time corresponds to the magnitude of the conduction current. In other words, there is a one-to-one correspondence between the triggering time and the conduction current. In this case, a higher conduction current will lead to a short triggering time and vice versa. Thus, by setting a given current ("trip point" current) and observing the time it takes for the signal SEN to drop sufficiently to trigger the turn on is one way of correlating between the magnitude of the conduction current being sensed and the triggering time. Conversely, given a fixed sensing time which corresponds to a given current, if the triggering time has not been reached at the end of the fixed sensing period, the conduction current being sensed must be lower than the given current, and vice versa.

Figure 19:
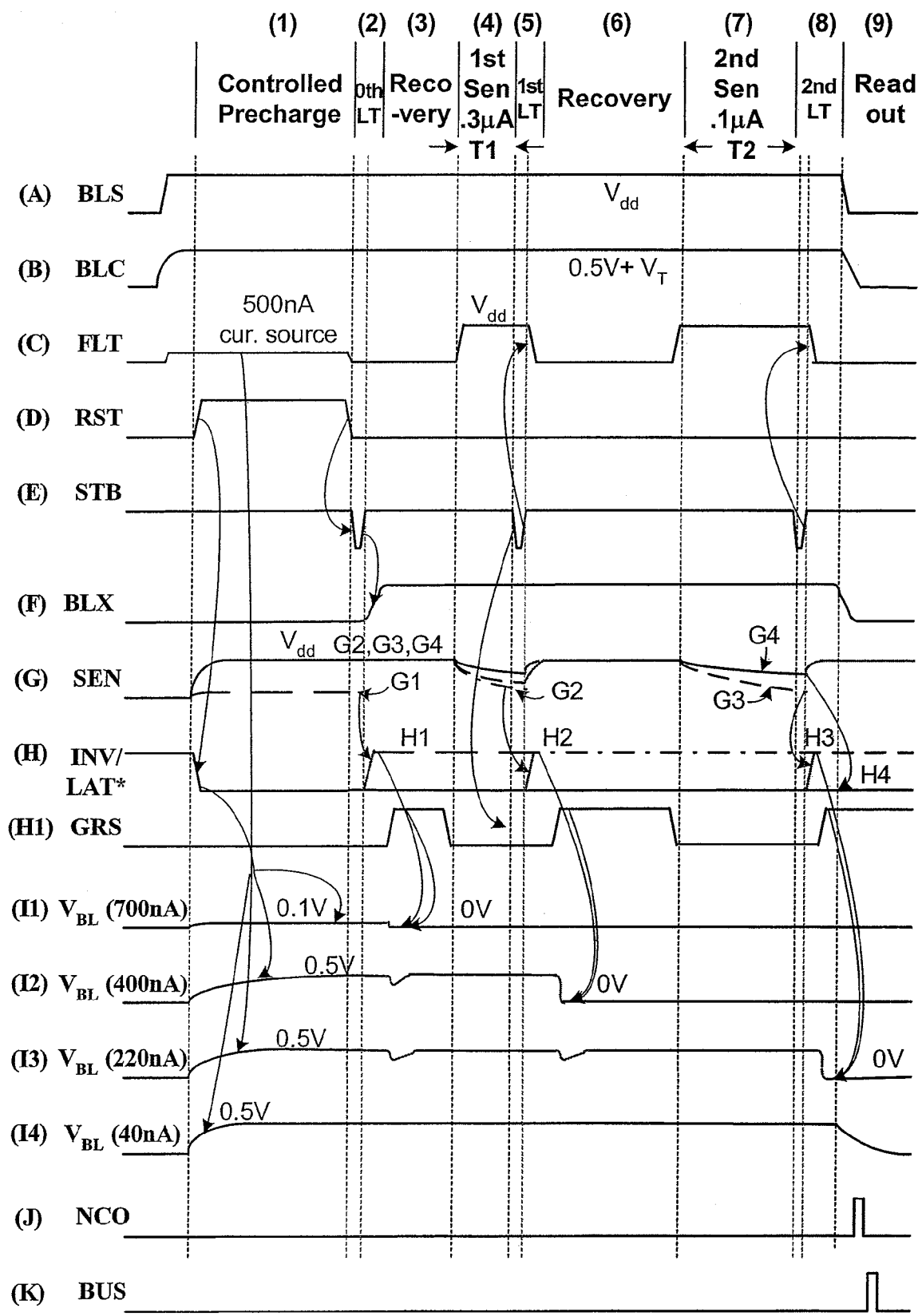
FIG. 19(A)-FIG. 19(K) are timing diagrams for the sense module shown in FIG. 18.

In FIG. 23, all things being equal with the typical sense amplifier 600, the STB generator's function in the reference sense amplifier 600-R is then to calibrate a triggering time corresponding to a given trip point current value. It outputs the result in the form of a strobe signal STB delineating an end time for the sensing period that was started by another signal such as FLT going HIGH as shown in FIG. 18 and FIG. 19. In this case, the start of the sensing period is timed by the signal FLT that initiates the discharge of the capacitor 652". Generally, the shorter the sensing period, the higher is the corresponding trip point current. The strobe signal is generated by the strobe generator 694. Whenever the signal SEN" at the sense node 671" has discharged to $V_{dd}-V_{TP}$, the p-transistor 656" will be turned on and result in the latch 660" being set with INV at HIGH and LAT at LOW. The flipping of the LAT to LOW is used to time the end of the sensing period in the form of a strobe. In one embodiment, the strobe generator is implemented as a one-shot multivibrator, triggered by LAT.

Again, as is with other control signals generated by the reference sense amplifier 600-R, any variation in manufacturing process or operating temperature will be minimized by their common-mode operation with the general population of sense amplifiers 600.

Sense Amplifier for Low-Voltage Operation

According to yet another aspect of the invention, the conduction current of a memory cell is measured by the rate it discharges a dedicated capacitor in a sense amplifier capable of operating with a supply voltage under 2V.

In the preferred implementation, the rate is given by the change in voltage drop across the capacitor after a predetermined period. However, in the case when a voltage condition on an interconnecting bit line prevents the voltage drop extending beyond a predetermined minimum voltage limit, the dynamic range of the voltage drop will be reduced and is delimited by the voltage at the start of the discharge, which is typically the supply voltage Vdd, and the minimum voltage limit, $V_{LIMIT}$. A reference voltage, corresponding to a reference current for comparison would be set within this dynamic range. The reference voltage comparison is accomplished by providing a transistor with its gate turn-on voltage serving as the reference voltage. In the case of a p-transistor, the turn-on voltage is given by $Vdd-|V_{TP}|$ so that when the discharged voltage drops to or below this level, the p-transistor will be turned on or "tripped". For this turn-on voltage to lie within the dynamic range, the condition $(Vdd-|V_{TP}|)>V_{LIMIT}$ must be satisfied. However, when the supply voltage Vdd is reduced, two issues may arise. First, the reference voltage comparison is then made within a correspondingly reduced dynamic range. Secondly, a preferred trip point voltage may be outside this reduced dynamic range. For example, when Vdd is so low such that $(Vdd-|V_{TP}|)<V_{LIMIT}$, the p-transistor can never trip since the turn-on voltage is lower than $V_{LIMIT}$.

The invention provides a voltage shifting device to boost the discharging capacitor's voltage by a predetermined amount to increase the upper limit of the dynamic range by $\Delta V$ so as to have adequate dynamic range in the voltage drop to provide sufficient resolution when comparing with a reference voltage corresponding to a reference conduction current. After the predetermined period, the capacitor is decoupled from the memory cell in order to remove the $V_{LIMIT}$ restriction and the voltage drop is reduced by the same predetermined amount $\Delta V$ before being compared to the reference voltage (which could be lower than $V_{LIMIT}$). In this way, the sense amplifier can operate with a low supply voltage even when the reference voltage, such as $(Vdd-|V_{TP}|)$ is lower than $V_{LIMIT}$.

Figure 24:
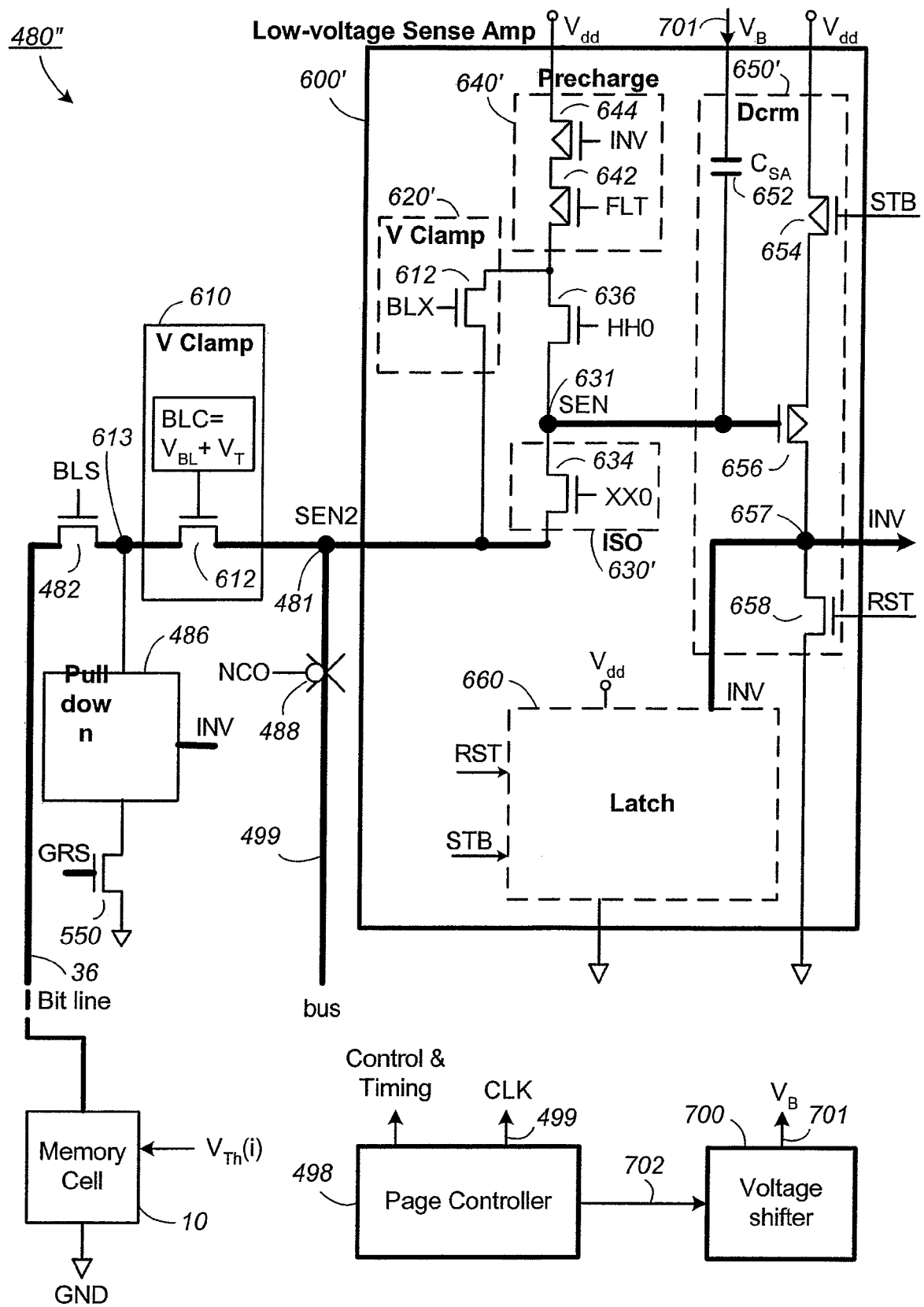
FIG. 24 illustrates another preferred embodiment of a sense module that is especially suitable for operating with a low supply voltage.

FIG. 24 illustrates a preferred embodiment of a sense module that is especially suitable for operating with a low supply voltage. The sense module 480" is similar to the sense module 480 shown in FIG. 14 and the sense module 480' in FIG. 18, except the sense amplifier 600' is able to operate with a supply voltage Vdd lower than 2V.

As described in connection with FIG. 14 and FIG. 18, the sense amplifier included in the sense module serves to measure the conduction current of the memory cell 10 via the coupled bit line 36. The measurement is accomplished by precharging the dedicated capacitor 652 and then noting the rate of discharge of the capacitor due to the memory cell's conduction current. The rate of discharge is measured by the change in voltage drop across the capacitor after a predetermined period of time. The turn-on gate voltage of the p-transistor 656 serves as a reference to compare against the amount of voltage drop. Thus, after the capacitor has discharged for the predetermined period of time, the voltage at the node SEN 631 will normally be either low enough to turn on the p-transistor 656, or otherwise, not sufficiently low to turn on the p-transistor.

A typical gate turn-on voltage for the p-transistor 656 is about $|V_{TP}|$ (typically 1.2V) below the drain supply voltage. In this case, it will be 1.2V below the supply voltage Vdd. If the supply voltage itself is at say, 1.8V, this would mean that the node SEN 631 would have to drop to below 0.6V before the p-transistor will trip. However, as described in an earlier section, the desired bit line voltage is maintained at a constant voltage at about 0.5V by the voltage clamp 610. For this voltage clamp to function properly, its drain side must be above 0.5V. This will impose a minimum floor voltage of $V_{LIMIT}$~0.5V on the node SEN2 481 and likewise for the node SEN 631. Thus, the node SEN 631 cannot have its voltage drop below this minimum floor voltage, $V_{LIMIT}$. When the supply voltage is low, the p-transistor may have its turn-on voltage lower than the minimum floor voltage and thus unable to ever turn on.

FIG. 24 illustrates a sense module 480" that includes a low-voltage sense amplifier 600'. The sense amplifier 600' includes a second voltage clamp 620', a bit line isolation circuit 630', a precharge circuit 640', a precharge circuit isolation transistor 636, a discriminator or compare circuit 650' and a latch 660. Similarly as before, the second voltage clamp 620' is to maintain sufficient voltage $V_{LIMIT}(>V_{BL})$ on the node SEN 2 or the drain of the transistor 612 so that the latter operates in saturation.

Thus, the sense node SEN 631 will initially be pulled up to Vdd by the precharge circuit 640' via the isolation transistor 636. When coupled to the memory cell 10 via the bit line 36 and intervening circuits, the voltage on the node SEN 631 will drop due to the discharge of the capacitor 652.

After a predetermined period, the change of voltage drop across the capacitor 652 will be proportional to the conduction current of the memory cell 10. The dynamic range of the voltage drop is given by Vdd on the pull-up end and $V_{LIMIT}$ on the drop-down end. For a high conduction current, the voltage on the node SEN 631 will drop to $V_{LIMIT}$. For lower conduction currents, the voltage will be above $V_{LIMIT}$. Thus, the given dynamic range would allow a corresponding range of conduction currents to be resolvable. In the preferred embodiment, a binary determination of whether the dropped voltage is higher or lower than a reference voltage is made by the compare circuit 650'. The compare circuit 650' comprises a p-transistor whose gate is connected to the dedicated capacitor 652. Whenever, the voltage of the capacitor (same as the voltage on the node SEN 631) drops below a threshold (Vdd–|$V_{TP}$|), the p-transistor is turned on, thereby pulling the signal INV to HIGH and latched accordingly by latch 660. However, for lower Vdd, given the existence of $V_{LIMIT}$, if (Vdd–|$V_{TP}$|)<$V_{LIMIT}$, then the p-transistor would never turn on.

The compare circuit 650' is adapted for low voltage operation by providing a voltage shifter 700 to supply a boost voltage $V_B$ via a line 701 to one plate of the capacitor 652. The timing of the voltage shifter is controlled by the page controller 498 via a line 702.

In operation, the precharge circuit 640' pulls the sense node SEN 631 to Vdd. The voltage shifter is activated after the node SEN has been decoupled from Vdd by the isolation transistor 636. The voltage shifter basically has the CLK signal level augment by ΔV, so that the voltage on the other plate of the capacitor at node SEN 631 will be boosted by an equal amount. This effectively increases the upper limit of the dynamic range by ΔV so that the final voltage corresponding to a moderate conduction current can be higher than Vdd–$V_{LIMIT}$. At the end of the discharging period, the sense node SEN 631 is decoupled from the node SEN2 through the isolation transistor 634 thereby removing the $V_{LIMIT}$ restriction. The voltage on SEN 631 is then reduced by the same ΔV to cancel the initial boosting before being compared to the reference voltage ($V_{dd}$–|$V_{TP}$|). This enables the voltage comparison to be made at a level even below the $V_{LIMIT}$.

The operation and timing of the low voltage sense amplifier 600' will be described by reference to both FIG. 24 and the timing diagrams FIGS. 25(A)-25(N). Essentially, the operation and timing is similar to that of the sense amplifier 600 described in connection with FIGS. 15(A)-15(K). The main difference is related to the additional operation of the voltage shifter on the capacitor 652 associated with each sensing period (e.g., Phase (4)$1^{st}$ Sensing and/or Phase (7) $2^{nd}$ Sensing.)

For example prior to Phase (4), as in the recovery Phase (3), the node SEN 631 is coupled to the memory cell and is being pulled up to Vdd. The pull-up is accomplished by the signals INV and FLT at LOW and the isolation transistor 636 to the node SEN 631 turned on by the signal HH0 (FIGS. 25(H)(3), 25(C)(3), 25(L)(3).)

After the pull-up, the precharge circuit is isolated from the sense node SEN 631 when the signal HH0 going LOW (FIG. 25(L)(3).) Then in the sensing Phase (4), the voltage shifter outputs the signal $V_B$ which rises to a predetermined level ΔV, thereby also boosting the voltage of the capacitor 652 at the sense node SEN 631 by ΔV (FIG. 25(N)(4).)

The capacitor 652 is coupled to the bit line 36 when the isolation transistor 634 is turned on by a signal XX0 (FIG. 25(M)(4).) The boosted voltage at the sense node SEN 631 decreases with time as the capacitor is discharged by the conduction current of the memory cell 10 via the bit line 36. As before, the rate of discharge is measured by the relative voltage drop after a predetermined period of discharge (FIG. 25(G)(4).) The boosted voltage is such that the final voltage drop is above the predetermined voltage limit (e.g., about 0.5V) imposed on the node SEN 631 when it is coupled to the bit line 36.

At the end of the discharge period, the sense node SEN 631 is isolated from the bit line with the signal XX0 going LOW. Then the boosting of the voltage at SEN 631 is removed with the signal $V_B$ returning to zero (FIG. 25(N), 25(G).) The voltage at SEN 631 is therefore down shifted by ΔV before being compared to the trip gate voltage of the p-transistor 656. If the voltage has dropped beyond |Vdd–$V_{TP}$|, then the p-transistor 656 will be turned on and will flip the signal INV to HIGH when strobed by the signal STB (FIG. 25(G), 25(E), 25(H).)

Figure 25:
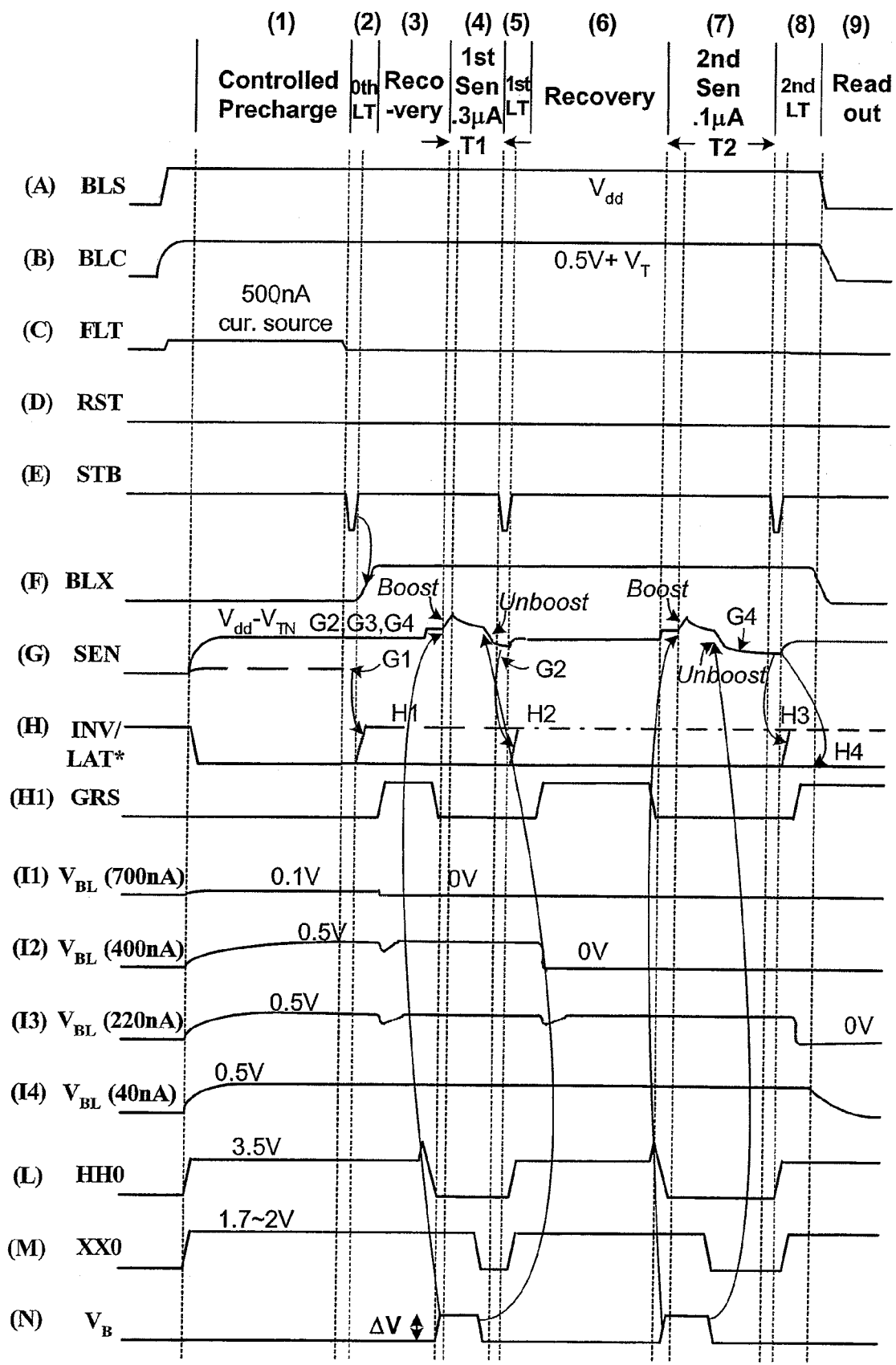
FIGS. 25(A)-25(N) are timing diagrams for the sense module shown in FIG. 24.

If the preferred sensing operation involves more than one pass, e.g., a second sensing pass such as Phase (7), shown in FIG. 25, then each sensing pass will have similar voltage shifting technique applied in order to allow for proper operation with a low voltage supply Vdd.

In another embodiment, even in the case of adequate supply voltage, (i.e., when Vdd–|$V_{TP}$|)>$V_{LIMIT}$ substantially, for the case of a p-transistor), the voltage shifter can still be implemented to provide an increased dynamic range within which a voltage comparison can be made to sense the conduction current of a memory cell. In other words, the voltage shifter can be implemented on a sense amplifier in general in order to increase the dynamic range of detection.

Figure 26:
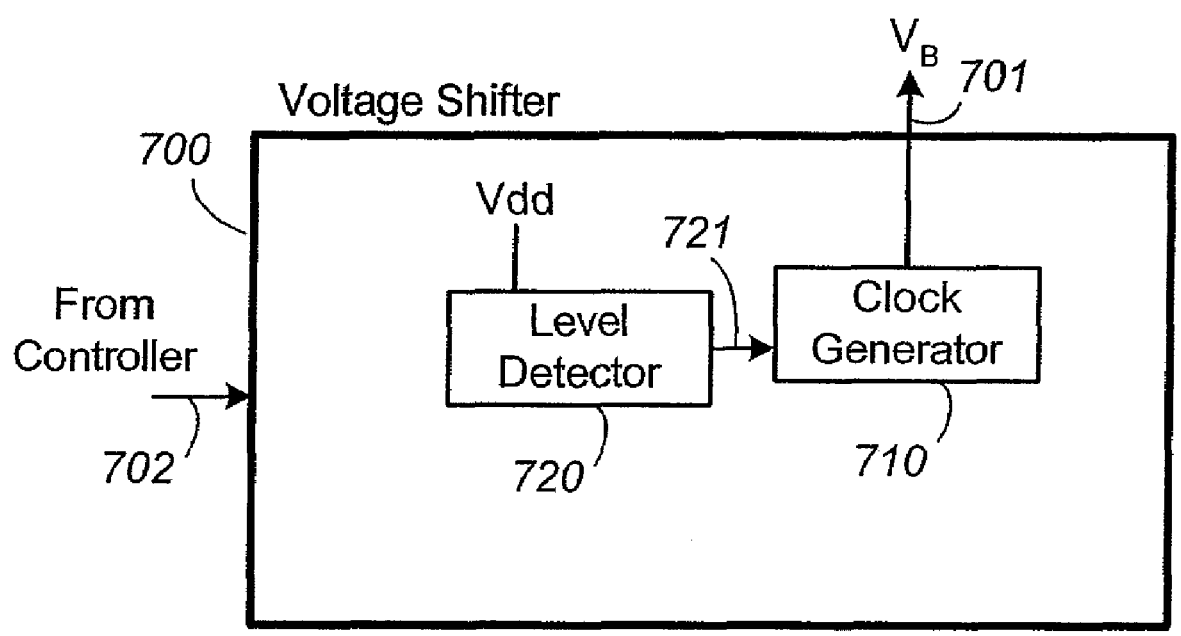
FIG. 26 illustrates yet another embodiment in which the voltage shifter is only enabled when the supply voltage falls below a predetermined level.

FIG. 26 illustrates yet another embodiment in which the voltage shifter is only enabled when the supply voltage falls below a predetermined level. As described earlier, in connection with FIG. 24, the voltage shifter 700 provides a boosted voltage level, ΔV, in the form of the signal $V_B$ supplied via the line 701 to one plate of the capacitor 652 of the sense amplifier 600'. The $V_B$ signal is generated by a clock generator 710. A level detector 720 detects the level of the supply voltage Vdd. Whether the clock generator 710 provides the boost voltage level ΔV to the capacitor 652 will depend on the detected Vdd level. If Vdd is detected to fall below a predetermined level, the level detector will output an enabling signal via an output 721 to the clock generator 710 to generate or enable the $V_B$ signal as shown in FIG. 25 (N). Otherwise, the voltage shifter 700 will not be activated or not produce a $V_B$ signal with the boost voltage ΔV. The predetermined level, for the case of a p-transistor, will be Vdd=|$V_{TP}$|)+$V_{LIMIT}$ plus a predetermined margin.

Although the various aspects of the present invention have been described with respect to certain embodiments, it is understood that the invention is entitled to protection within the full scope of the appended claims.

It is claimed:

1. A method of sensing a conduction current of a memory cell comprising:
    charging a capacitor by coupling to a voltage supply to an initial voltage above a reference voltage;
    decoupling the capacitor from the voltage supply;
    boosting the voltage on the capacitor by a predetermined amount after said decoupling;
    coupling the capacitor to the memory cell via an intermediate circuit;
    discharging the capacitor with the conduction current of the memory cell for a predetermined period of time such that the voltage on the capacitor decreases to a discharged voltage;
    decoupling the capacitor from the intermediate circuit;

reducing the discharged voltage on the capacitor by the predetermined amount; and comparing the voltage on the capacitor with the reference voltage to give a measure of said conduction current.

2. The method of claim 1, wherein the discharged voltage is higher or equal to a minimum voltage imposed by the intermediate circuit.

3. The method of claim 1, wherein the discharged voltage reduced by said predetermined amount lies in a range that extends below the minimum voltage imposed by the intermediate circuit.

4. The method of claim 1, wherein said boosting the voltage on the capacitor includes supplying a clock signal to said capacitor.

5. The method of claim 4, wherein said boosting takes place on a rising edge of the clock signal.

6. The method of claim 4, wherein said reducing takes place on a falling edge of the clock signal.

7. The method of claim 1, wherein:
the intermediate circuit includes one or more of transistor in series.

8. The method of claim 1, wherein:
said intermediate circuit includes at least a portion of a bit line coupled to said memory cell.

9. The method of claim 8, further including maintaining the bit line at a constant voltage during said discharging of said capacitor.

10. The method of claim 1, wherein the voltage supply provides a voltage below two volts.

11. The method of claim 1, wherein:
the memory cell is one of a plurality of memory cells of a flash EEPROM.

12. The method as in any one of claims 1-11, wherein:
said memory cell stores one bit of data.

13. The method as in any one of claims 1-11, wherein:
said memory cell stores more than one bit of data.

14. A sensing circuit for sensing a conduction current of a memory cell, comprising:

a capacitor;

a voltage supply a precharge circuit powered by said voltage supply and coupleable to said capacitor;

a voltage shifter able to shift the voltage on said capacitor;

a voltage supply for charging a capacitor to a voltage initially at a first level;

means for discharging the capacitor with said conduction current so that the voltage discharges from the first level;

a voltage shifter for boosting the voltage by a predetermined amount;

means for terminating discharging the capacitor after a predetermined period of time;

means for reducing the voltage by the predetermined amount to a final level; and a comparator for comparing the final level with a reference voltage level to give a measure of said conduction current.

15. The sensing circuit in claim 14, wherein each memory cell stores one bit of data.

16. The sensing circuit as in claim 14, wherein each memory cell stores more than one bit of data.

\* \* \* \* \*